(12) United States Patent
Kaushal et al.

(10) Patent No.: US 7,340,377 B2
(45) Date of Patent: Mar. 4, 2008

(54) MONITORING A SINGLE-WAFER PROCESSING SYSTEM

(75) Inventors: Sanjeev Kaushal, Austin, TX (US); Pradeep Pandey, San Jose, CA (US); Kenji Sugishima, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 46 days.

(21) Appl. No.: 11/456,020

(22) Filed: Jul. 6, 2006

(65) Prior Publication Data

US 2007/0233427 A1     Oct. 4, 2007

Related U.S. Application Data

(63) Continuation of application No. 11/278,379, filed on Mar. 31, 2006.

(51) Int. Cl.
*G06F 11/30*     (2006.01)
(52) U.S. Cl. .................................................. 702/185
(58) Field of Classification Search ................. 702/185
See application file for complete search history.

(56) References Cited

U.S. PATENT DOCUMENTS

| | | | |
|---|---|---|---|
| 5,642,296 A | 6/1997 | Saxena | |
| 6,195,621 B1 | 2/2001 | Bottomfield | |
| 6,351,723 B1 | 2/2002 | Maekawa | |
| 6,441,350 B1 | 8/2002 | Stoddard et al. | |
| 6,803,548 B2 | 10/2004 | Wang et al. | |
| 7,165,011 B1 * | 1/2007 | Kaushal et al. | 702/182 |

FOREIGN PATENT DOCUMENTS

| | | |
|---|---|---|
| WO | 20070030193 A | 3/2007 |
| WO | 20070030194 A | 3/2007 |

OTHER PUBLICATIONS

A. Emami-Naeaini et al., Model-based control for semiconductor and advanced materials processing: an overview; American Control Conference, 2004, vol. 5, Jun. 30, 2004, pp. 3902-3909.
Roy G. Gordon et al., A kinetic model for step coverage by atomic layer deposition in narrow holes or trenches; Chemical Vapor Deposition, vol. 9, No. 2, Mar. 20, 2003, pp. 73-78.
European Patent Office, International Search Report and Written Opinion received in corresponding PCT Application No. PCT/US2007/065473, dated Aug. 17, 2007, 14 pgs.

* cited by examiner

*Primary Examiner*—John Barlow
*Assistant Examiner*—Aditya S. Bhat
(74) *Attorney, Agent, or Firm*—Wood, Herron & Evans, LLP

(57) ABSTRACT

A method of monitoring a single-wafer processing system in real-time using low-pressure based modeling techniques that include processing a wafer in a processing chamber; determining a measured dynamic process response for a rate of change for a process parameter; executing a real-time dynamic model to generate a predicted dynamic process response; determining a dynamic estimation error using a difference between the predicted dynamic process response and the expected process response; and comparing the dynamic estimation error to operational limits.

33 Claims, 11 Drawing Sheets

MONITORING A SINGLE-WAFER PROCESSING SYSTEM

CROSS-REFERENCE TO RELATED APPLICATIONS

This application is a continuation of co-pending U.S. patent application Ser. No. 11/278,379 entitled "MONITORING A SYSTEM DURING LOW-PRESSURE PROCESSES," filed on Mar. 31, 2006. This application is related to co-pending U.S. patent application Ser. No. 11/278,382 entitled "MONITORING A MONOLAYER DEPOSITION (MLD) SYSTEM USING A BUILT-IN SELF TEST (BIST) TABLE," filed Mar. 31, 2006, and co-pending U.S. patent application Ser. No. 11/278,386 entitled "METHOD FOR CREATING A BUILT-IN SELF TEST (BIST) TABLE FOR MONITORING A MONOLAYER DEPOSITION (MLD) SYSTEM," filed on Mar. 31, 2006. The entire contents of these applications are herein incorporated by reference in their entirety.

FIELD OF THE INVENTION

This invention relates to methods for monitoring a single-wafer processing system to detect, diagnose, and predict fault conditions for a single-wafer processing system employed in low-pressure semiconductor processing.

BACKGROUND OF THE INVENTION

Several processes in semiconductor manufacturing involve processing wafers at low-pressure. In a typical such process, the process chamber is brought to a reduced pressure; subsequently certain process gases are introduced into the chamber to create desired process conditions.

For illustration purpose, we describe one such process in some detail. Several methods have been developed for creating thin films on wafers used in manufacturing semiconductor devices. Among the more established techniques is Chemical Vapor Deposition (CVD). Atomic Layer Deposition (ALD), a variant of CVD, is a relatively newer technology now emerging as a potentially superior method of achieving highly uniform, conformal film deposition.

ALD has demonstrated an outstanding ability to maintain ultra-uniform thin deposition layers over complex topology. This is at least partially true because ALD is not as flux dependent as is CVD. This flux-independent nature of ALD allows processing at lower temperatures than with conventional CVD methods.

The technique of ALD is based on the principle of the formation of a saturated monolayer of reactive precursor molecules by chemisorption. A typical ALD process consists of injecting a precursor $R_A$ for a period of time until a saturated monolayer is formed on the wafer. Then, the precursor $R_A$ is purged from the chamber using an inert gas, GI. This is followed by injecting precursor $R_B$ into the chamber, also for a period of time thus forming the layer AB on the wafer. Then, the precursor $R_B$ is purged from the chamber. This process of introducing $R_A$, purging the reactor, introducing $R_B$, and purging the reactor can be repeated a number of times to achieve an AB film of a desired thickness.

This process is also illustrative of the types of issue encountered in such low-pressure processing. For example:

1) Film quality and composition can be greatly impacted in case of the flow rates of the Reactants $R_A$ and $R_B$ fail be as desired in the recipe. For example, if the MFC corresponding to the reactant fails to perform as desired to deliver the recipe setpoint flow rate value the film quality can be affected.

2) In-situ measurements providing details of wafer condition, such as when saturation of a precursor monolayer is completed on the wafer(s), are not available; this hinders the ability to control and optimize processing conditions so as to achieve optimal performance and throughput.

SUMMARY OF THE INVENTION

The present invention provides a method and apparatus for indicating degraded performance of the reactant flow rates in low-pressure processes. The invention provides a method of monitoring a single-wafer processing system that includes positioning a wafer on a wafer holder in a single-wafer processing chamber; reducing pressure in the chamber; performing a single-wafer process on the wafer; and monitoring the single-wafer process using a process model, the process model being created using a set of nonlinear differential equations $\dot{x}_1$ and an output equation $y_1$, wherein $$\dot{x}_1 = f(x_1, p_1, u_1)$$

$$y_1 = g(x_1, p_1, u_1)$$

and $x_1$, $p_1$, and $u_1$ are single-wafer process parameters in which the vector $x_1$ comprises a state vector, the vector $pi$ comprises one or more modeling parameters, the vector $u_1$ comprises one or more inputs applied to the process. The method includes calculating dynamic estimation errors for the single-wafer process; comparing the dynamic estimation errors to operational limits established by one or more BIST rules in the BIST table for the single-wafer process; and continuing the single-wafer process when the dynamic estimation errors are within operational limits. The method further includes comparing the dynamic estimation errors to warning limits established for the single-wafer process when the dynamic estimation errors are not within operational limits, and either sending a warning message identifying a potential problem with the single-wafer process and/or single-wafer processing system and continuing the single-wafer process when the dynamic estimation errors are within the warning limits, wherein the warning message is determined by the BIST rule currently being used, or sending a fault message identifying a known problem with the single-wafer process and/or single-wafer processing system and stopping the single-wafer process when the dynamic estimation errors are not within the warning limits established for the single-wafer process, wherein the fault message is determined by the BIST rule currently being used.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF EMBODIMENTS OF THE INVENTION

The invention relates to semiconductor manufacturing processes that involve low-pressure processing. Examples of these processes include atomic layer deposition (ALD/MLD,xLD) for films including $Si_3N_4$, $Al_2O_3$, $Ta_2O_5$, and HfSiON, chemical vapor deposition (CVD), and etch.

Such processes are conducted in both hot-wall and cold-wall processing chambers. These processing chambers are typically configured for single-wafer, multi-wafer, or batch operation. Such processing chambers can be used for processing various types of wafers, including Silicon wafers and LCD panels.

A semiconductor processing system can include a thermal processing system, an etching system, a deposition system, a plating system, a polishing system, an implant system, a developing system, or a transfer system, or a combination of two or more thereof. In addition, the process performed by the system can include a thermal process, an etching process, a deposition process, a plating process, a polishing process, an implant process, a developing process, or a transfer process, or a combination of two or more thereof.

In accordance with the present invention, a processing system can be monitored in real-time using a Built-In Self Test (BIST) table. In one embodiment, one or more process parameters are changed or maintained, responses thereto are predicted and measured, and a dynamic estimation error is calculated and compared to operational limits and/or warning limits established for BIST rules in the BIST table. The process can then be continued, paused or stopped depending on whether the dynamic estimation error is within the operational limits and/or within the warning limits in the BIST table.

In one embodiment of the present invention, a method is provided for the detection, diagnosis, and prediction of fault conditions to identify malfunction and error conditions in the semiconductor equipment as well as indicate drift and degradation that may lead to fault conditions.

In another or further embodiment, the present invention identifies malfunctions and/or error conditions in the processing system as well as indicates drift and degradation that may be leading to an impending fault condition. Data to analyze the processing system can be obtained either in a "Passive Mode", during a productive operation of the system, or in an "Active Mode", where periodic self-tests are conducted during idle time.

Figure 1:
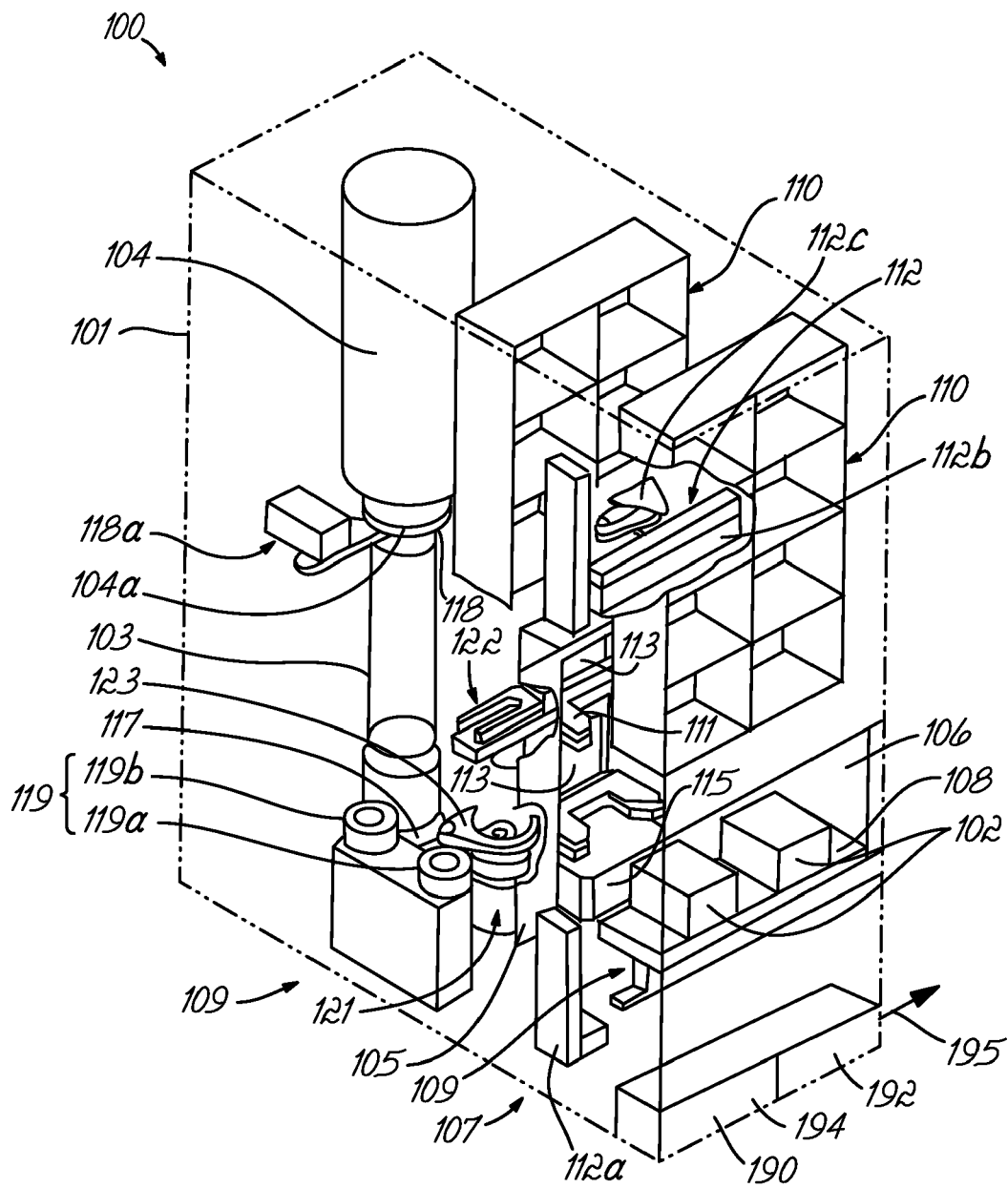
FIG. 1 is an isometric view of a processing system in accordance with embodiments of the invention.

The invention will now be described with reference to the drawings. FIG. 1 is an isometric view of a processing system in accordance with embodiments of the invention. The processing system 100 can comprise a housing 101 that forms the outside walls of the processing system when it is configured in a clean room. The interior of the housing 101 is divided by a partition (bulkhead) 105 into a carrier-transferring area 107 into and from which carriers 102 are conveyed and in which the carriers 102 are kept, and a loading area 109 where wafers to be processed (not shown), such as semiconductor wafers W, located in the carriers 102 are transferred to boats 103. The boats are loaded into or unloaded from a vertical type thermal processing chamber 104.

As shown in FIG. 1, an entrance 106 is provided in the front of the housing 101 for introducing and discharging the carriers 102 by an operator or an automatic conveying robot (not shown). The entrance 106 is provided with a door (not shown) that can move vertically to open and close the entrance 106. A stage 108 is provided near the entrance 106 in the carrier-transferring area 107 for placing the carriers 102 thereon.

As shown in FIG. 1, a sensor mechanism 109 is provided at the rear portion of the stage 108 for opening a lid (not shown) of a carrier 102 and detecting positions of and the number of the semiconductor wafers W in the carrier 102. In addition, there may be shelf-like storing sections 110 above the stage 108 for storing a plurality of the carriers 102.

Two carrier-placing portions (transfer stages) 111 are provided in vertically spaced positions as tables for placing the carriers 102 thereon for transferring the semiconductor wafers W. Thus, the throughput of the processing system 100 can be improved as one carrier 102 can be exchanged at one carrier-placing portion 111 while the semiconductor wafers W are transferred to another carrier 102 at the other carrier-placing portion 111.

A carrier transference mechanism 112 is arranged in the carrier-transferring area 107 for transferring the carriers 102 to and from the stage 108, the storing sections 110, and the carrier placing portions 111. The carrier transference mechanism 112 comprises: an elevating arm 112b which can be moved vertically by an elevating mechanism 112a provided on a side of the carrier-transferring area 107, and a transferring arm 112c mounted on the elevating arm 112b for supporting the bottom of the carrier 102 to horizontally transfer the carrier 102.

For example, the carrier 102 can be a closed type, which can house 13 or 25 wafers and which can be hermetically closed by a lid (not shown). The carrier 102 can comprise a portable plastic container for housing and holding wafers W in multistory in horizontal attitude and in vertically spaced relation by a prescribed pitch. In one embodiment, the diameter of the wafer W can be 300 mm. Alternatively, other wafer sizes may be used. The lid (not shown) is removably attached at the wafer-entrance formed in the front of the carrier 102 in such a manner that the lid can sealingly close the wafer-entrance.

Clean atmospheric air, which has passed through filters (not shown), can be provided into the carrier-transferring area 107, so that the carrier-transferring area 107 is filled with the clean atmospheric air. In addition, clean atmospheric air can also be provided into the loading area 109, so that the loading area 109 is filled with the clean atmospheric air. Alternatively, an inert gas, such as nitrogen ($N_2$), is supplied into the loading area 109, so that the loading area is filled with the inert gas.

As shown in FIG. 1, the partition 105 has two openings 113, upper and lower, for transferring a carrier 102. The openings 113 can be aligned with the carrier-placing portions 111. Each opening 113 is provided with a lid (not shown) for opening and closing the opening 113. The opening 113 is formed in such a manner that the size of the opening 113 is substantially the same as that of the wafer-entrance of the carrier 102, so that semiconductor wafers W can be transferred into and from the carrier 102 through the opening 113 and the wafer-entrance.

In addition, a notch aligning mechanism 115 is arranged below the carrier-placing portions 111 and along a vertical central line of the carrier-placing portion 111 for aligning notches (cut portions) provided at peripheries of the semiconductor wafers W i.e. for aligning the crystalline directions of the semiconductor wafers W. The notch aligning mechanism 115 has an opening on the side of the loading area 107. The notch aligning mechanism 115 is adapted to align the notches of the semiconductor wafers W transferred from the carrier 102 on the carrier-placing portion 111 by a transferring mechanism 122.

The notch aligning mechanism 115 has two apparatus in vertically spaced positions, and each apparatus can align the notches of the wafers W. Thus, the throughput of the processing system 100 can be improved because one apparatus can transfer back the aligned wafers W to the boat 103 while the other apparatus aligns other wafers W. Each apparatus may be adapted to align plural, for example three or five wafers at a time, such that the time for transferring the wafers W can be substantially reduced.

The thermal processing chamber 104 is disposed in a rear and upper portion in the loading area 109. The thermal processing chamber 104 has a chamber opening 104a in the bottom thereof. A lid 117 is provided below the chamber 104. The lid 117 is adapted to be vertically moved by an elevating mechanism (not shown) for loading a boat 103 into and unloading it from the chamber 104 and for opening and closing the chamber opening 104a. The boat 103, which can hold a large number of, for example 100 or 150 semiconductor wafers W in vertical equally spaced multistory, is adapted to be placed on the lid 117. The boat 103 is made of crystal or the like. The thermal processing chamber 104 is provided with a shutter 118 at the chamber opening 104a for closing the chamber opening 104a while the lid 117 is taken off and the boat 103 is unloaded after the thermal processing. The shutter 118 is adapted to horizontally pivot to open and close the chamber opening 104a. A shutter driving mechanism 118a is provided to make the shutter 118 pivot.

Still referring to FIG. 1, a boat-placing portion (boat stage) 119 is disposed in a side region of the loading area 109 for placing the boat 103 thereon when transferring semiconductor wafers W into and from the boat 103. The boat-placing portion 119 has a first placing portion 119a and a second placing portion 119b arranged between the first placing portion 119a and the lid 117. A ventilating unit (not shown) is disposed adjacent the boat-placing portion 119 for cleaning the circulation gas (the clean atmospheric air or the inert gas) in the loading area 109 using filters.

A boat-conveying mechanism 121 is arranged between the carrier-placing portion 111 and the thermal processing chamber 104 in the lower portion in the loading area 109 for conveying the boat 103 between the boat-placing portion 119 and the lid 117. Specifically, the boat-conveying mechanism 121 is arranged for conveying the boat 103 between the first placing portion 119a or the second placing portion 119b and the lowered lid 117, and between the first placing portion 119a and the second placing portion 119b.

A transferring mechanism 122 is arranged above the boat-conveying mechanism 121 for transferring semiconductor wafers W between the carrier 102 on the carrier-placing portion 111 and the boat 103 on the boat-placing portion 119, and more specifically, between the carrier 102 on the carrier-placing portion 111 and the notch aligning mechanism 115, between the notch aligning mechanism 115 and the boat 103 on the first placing portion 119a of the boat-placing portion 119, and between the boat 103 after the thermal processing on the first placing portion 119aand a vacant carrier 102 on the carrier-placing portion 111.

As shown in FIG. 1, the boat-conveying mechanism 121 has an arm 123 which can support one boat 103 vertically and move (expand and contract) horizontally. For example, the boat 103 can be conveyed in a radial direction (a horizontal linear direction) with respect to the rotational axis of the arm 123 by synchronously rotating the arm 123 and a support arm (not shown). Therefore, the area for conveying the boat 103 can be minimized, and the width and the depth of the processing system 100 can be reduced.

The boat-conveying mechanism 121 conveys a boat 103 of unprocessed wafers W from the first placing portion 119a to the second placing portion 119b. Then, the boat-conveying mechanism 121 conveys a boat 103 of processed wafers W from the lid 117 to the first placing portion 119a. Then, the boat-conveying mechanism 121 conveys the boat 103 of unprocessed wafers W onto the lid 117. In this manner, the unprocessed wafers W are prevented from being contaminated by particles or gases coming from the boat 103 of processed wafers W.

When a carrier 102 is placed on the stage 108 through the entrance 106, the sensor mechanism 109 detects the placing state of the carrier 102. Then, the lid of the carrier 102 is opened, and the sensor mechanism 109 detects positions of and the number of the semiconductor wafers W in the carrier 102. Then, the lid of the carrier 102 is closed again, and the carrier 102 is conveyed into a storing section 110 by means of the carrier transference mechanism 112.

A carrier 102 stored in the storing section 110 is conveyed onto the carrier-placing portion 111 at a suitable time by means of the carrier transference mechanism 112. After the lid of the carrier 102 on the carrier-placing portion 111 and the door of the opening 113 of the partition 105 are opened, the transferring mechanism 122 takes out semiconductor wafers W from the carrier 102. Then, the transferring mechanism 122 transfers them successively into a vacant boat 103 placed on the first placing portion 119a of the boat-placing portion 119 via the notch aligning mechanism 115. While the wafers W are transferred, the boat-conveying mechanism 121 is lowered to evacuate from the transferring mechanism 122, so that the interference of the boat-conveying mechanism 121 and the transferring mechanism 122 is prevented. In this manner, the time for transferring the semiconductor wafers W can be reduced, so that the throughput of the processing system 100 can be substantially improved.

After the transference of the wafers W is completed, the transferring mechanism 122 can move laterally from an operating position to a holding position in the other side region of the housing 101.

After the thermal processing is completed, the lid 117 is lowered, and the boat 103 and the thermally processed wafers are moved out of the thermal processing chamber 104 into the loading area 109. The shutter 118 hermetically closes the opening 104a of the chamber immediately after the lid 117 has removed the boat 103. This minimizes the heat transfer out of the thermal processing chamber 104 into the loading area 109, and minimizes the heat transferred to the instruments in the loading area 109.

After the boat 103 containing the processed wafers W is conveyed out from the thermal processing chamber 104, the boat-conveying mechanism 121 conveys another boat 103 of unprocessed wafers W from the first placing portion 119a to the second placing portion 119b. Then, the boat-conveying mechanism 121 conveys the boat 103 containing the processed wafers W from the lid 117 to the first placing portion 119a. Then, the boat-conveying mechanism 121 conveys the boat 103 of unprocessed wafers from the second placing portion 119b onto the lid 117. Therefore, the unprocessed semiconductor wafers W in the boat 103 are prevented from being contaminated by particles or gases coming from the boat 103 of processed wafers W when the boats 103 are moved.

After the boat 103 of unprocessed wafers W is conveyed onto the lid 117, the boat 103 and the lid 117 are introduced into the thermal processing chamber 104 through the opening 104a after the shutter 118 is opened. The boat 103 of unprocessed wafers W can then be thermally processed. In addition, after the boat 103 of processed wafers W is conveyed onto the first placing portion 119a, the processed semiconductor wafers W in the boat 103 are transferred back from the boat 103 into the vacant carrier 102 on the carrier-placing portion 111 by means of the transferring mechanism 122. Then, the above cycle is repeated.

Setup, configuration, and/or operational information can be stored by the processing system 100, or obtained from an operator or another system, such as a factory system. BIST tables can be rule-based and can be used to specify the action taken for normal processing and the actions taken on exceptional conditions. Configuration screens can be used for defining and maintaining BIST tables. The operational limits, operational conditions, the BIST rules associated with them can be stored and updated as required. Documentation and help screens can be provided on how to create, define, assign, and maintain the BIST tables.

BIST tables can be used to determine when a process is paused and/or stopped, and what is done when a process is paused and/or stopped. In addition, BIST tables can be used to determine when to change a process and how to change the process. Furthermore, the BIST tables can be used to determine when to select a different dynamic/static model and how to create a new operational limit, and/or a new BIST rule in the process. In general, BIST tables allow system operation to change based on the dynamic state of the system.

In one embodiment, processing system 100 can comprise a system controller 190 that can include a processor 192 and a memory 194. Memory 194 can be coupled to processor 192, and can be used for storing information and instructions to be executed by processor 192. Alternatively, different controller configurations can be used. In addition, system controller 190 can comprise a port 195 that can be used to couple processing system 100 to another system (not shown). Furthermore, controller 190 can comprise input and/or output devices (not shown) for coupling the controller 190 to other elements of the system.

In addition, the other elements of the system can comprise processors and/or memory (not shown) for executing and/or storing information and instructions to be executed during processing. For example, the memory may be used for storing temporary variables or other intermediate information during the execution of instructions by the various processors in the system. One or more of the system elements can comprise means for reading data and/or instructions from a computer readable medium. In addition, one or more of the system elements can comprise means for writing data and/or instructions to a computer readable medium.

Memory devices can include at least one computer readable medium or memory for holding computer-executable instructions programmed according to the teachings of the invention and for containing data structures, tables, records, rules, or other data described herein. System controller 190 can use data from computer readable medium memory to generate and/or execute computer executable instructions. The processing system 100 can perform a portion or all of the methods of the invention in response to the system controller 190 executing one or more sequences of one or more computer-executable instructions contained in a memory. Such instructions may be received by the controller from another computer, a computer readable medium, or a network connection.

Stored on any one or on a combination of computer readable media, the present invention includes software for controlling the processing system 100, for driving a device or devices for implementing the invention, and for enabling the processing system 100 to interact with a human user and/or another system, such as a factory system. Such software may include, but is not limited to, device drivers, operating systems, development tools, and applications software. Such computer readable media further includes the computer program product of the present invention for performing all or a portion (if processing is distributed) of the processing performed in implementing the invention.

In addition, at least one of the elements of the processing system 100 can comprise a graphic user interface (GUI) component (not shown) and/or a database component (not shown). In alternate embodiments, the GUI component and/or the database component are not required. The user interfaces for the system can be web-enabled, and can provide system status and alarm status displays. For example, a GUI component (not shown) can provide easy-to-use interfaces that enable users to: view status; create and edit SPC charts; view alarm data; configure data collection applications; configure data analysis applications; examine historical data; review current data; generate e-mail warnings; run multivariate models; view diagnostics screens; and view/create/edit BIST tables in order to more efficiently troubleshoot, diagnose, and report problems with the processing system 100.

Figure 2:
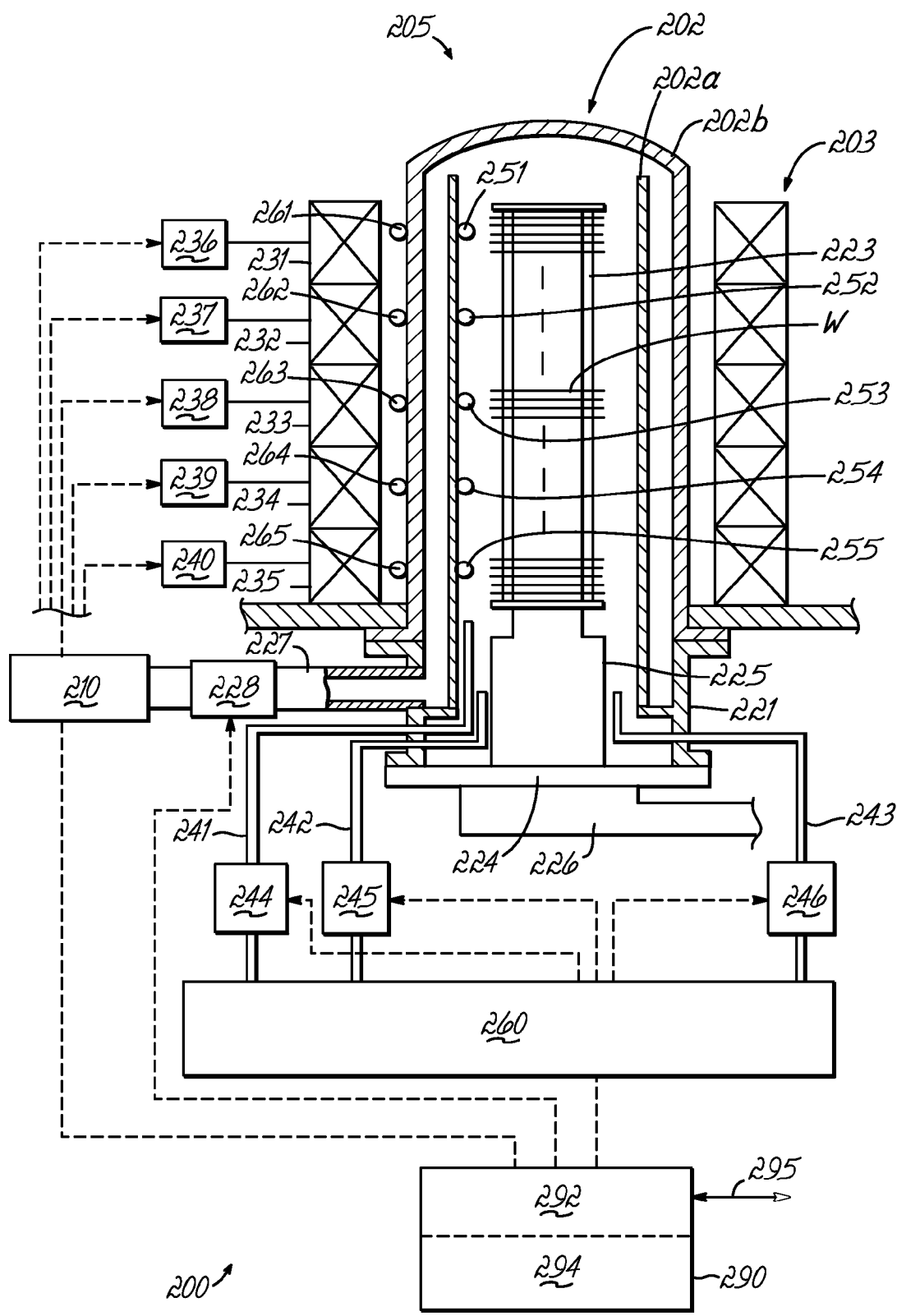
FIG. 2 is a partial cut-away schematic view of a portion of a processing system in accordance with embodiments of the invention.

FIG. 2 is a partial cut-away schematic view of a portion of a semiconductor wafer processing system 200 in accordance with embodiments of the invention. In the illustrated embodiment, a processing system 205, an exhaust system, 210, a gas supply system 260, and a controller 290 are shown.

The processing system 205 can comprise a vertically oriented processing chamber (reaction tube) 202 having a double structure including an inner tube 202a and an outer tube 202b which are formed of, e.g., quartz, and a cylindrical manifold 221 of metal disposed on the bottom of processing chamber 202. The inner tube 202a is supported by the manifold 221 and has an open top. The outer tube 202b has its lower end sealed air-tight to the upper end of the manifold 221 and has a closed top.

In the processing chamber 202, a number of wafers W (e.g., 150) are mounted on a wafer boat 223 (wafer holder), horizontally one above another at a certain pitch in a shelves-like manner. The wafer boat 223 is held on a lid 224 through a heat insulation cylinder (heat insulator) 225, and the lid 224 is coupled to moving means 226.

The processing system 205 can also comprise a heater 203 in the form of, e.g., a resistor disposed around the processing chamber 202. The heater 203 can comprise five stages of heaters 231-235. Alternatively, a different heater configuration can be used. The respective heater stages 231-235 are supplied with electric power independently of one another from their associated electric power controllers 236-240. The heater stages 231-235 can be used to divide the interior of the processing chamber 202 into five zones.

A gas supply system 260 is shown coupled to the controller 290 and the processing system 205. The manifold 221 has a plurality of gas feed pipes 241-243 for feeding gases into the inner tube 202a. In one embodiment, dichlorosilane, ammonium, and nitrogen can be fed to the respective gas feed pipes 241, 242, 243 through flow rate adjusters 244, 245, 246, such as mass flow controllers (MFCs). Alternatively, a multi-zone gas injection system can be used and/or other process gasses may be used.

An exhaust pipe 227 is connected to the manifold 221 for the exhaustion through the gap between the inner pipe 202a and the outer pipe 202b. The exhaust pipe 227 is connected to an exhaust system 210 that can include a vacuum pump (not shown). A pressure adjuster 228 including a combination valve, a butterfly valve, valve drivers, etc. can be inserted in the exhaust pipe 227 for adjusting a pressure in the processing chamber 202. Alternatively, a different configuration may be used for the exhaust system 210.

The processing system 205 can also comprise a number of sensors. In the illustrated embodiment, five inner temperature sensors (thermocouples) 251-255 are disposed on the inside of the inner tube 202a in vertical alignment with each other. The inner temperature sensors 251-255 are covered with, e.g., quartz pipes for the prevention of metal contamination of semiconductor wafers W. The inner temperature sensors 251-255 are arranged corresponding to the five zones. Alternatively, a different number of zones may be used, a different number of inner temperature sensors may be used, and the inner sensors may be positioned differently. In another embodiment, optical techniques can be used to measure temperature.

A plurality of outer temperature sensors (thermocouples/temperature meters) 261-265 is disposed on the outside of the outer tube 202b in vertical alignment with each other. The outer temperature sensors 261-265 can also be arranged corresponding to the five zones. Alternatively, a different number of zones may be used, a different number of outer temperature sensors may be used, and the outer sensors may be positioned differently.

The controller 290 can be used to control treatment parameters, such as a temperature of a treatment atmosphere, a gas flow rate, and pressure in the processing chamber 202. The controller 290 receives output signals of the inner temperature sensors 251-255 and outer temperature sensors 261-265 to output control signals to the electric power controllers 236-240, the pressure adjuster 228 and the flow rate adjusters 244-246.

Setup, configuration, and/or operational information can be stored by the controller 290, or obtained from an operator or another controller, such as a controller 190 (FIG. 1). Controller 290 can also use BIST tables to determine the action taken for normal processing and the actions taken on exceptional conditions. Controller 290 can manage configuration screens that can be used for defining and maintaining BIST tables. Controller 290 can store and update the BIST tables as required. Controller 290 can manage documentation and help screens that can be used to create, define, assign, and maintain the BIST tables.

Controller 290 can use BIST tables in real time to determine when a process is paused and/or stopped, and what is done when a process is paused and/or stopped. In addition, BIST tables can be used to determine when to change a process and how to change the process.

In one embodiment, controller 290 can include a processor 292 and a memory 294. Memory 294 can be coupled to processor 292, and can be used for storing information and instructions to be executed by processor 292. Alternatively, different controller configurations can be used. In addition, system controller 290 can comprise a port 295 that can be used to couple controller 290 to another computer and/or network (not shown). Furthermore, controller 290 can comprise input and/or output devices (not shown) for coupling the controller 290 to the processing system 205, exhaust system, 210, and gas supply system 260.

Controller 290 can comprise means for reading data and/or instructions from a computer readable medium. In addition, controller 290 can comprise means for writing data and/or instructions to a computer readable medium.

Memory 294 can include at least one computer readable medium or memory for holding computer-executable instructions programmed according to the teachings of the invention and for containing data structures, tables, records, rules, or other data described herein. Controller 290 can use data from computer readable medium memory to generate and/or execute computer executable instructions. The processing system 205, exhaust system, 210, a gas supply system 260, and a controller 290 can perform a portion or all of the methods of the invention in response the execution of one or more sequences of one or more computer-executable instructions contained in a memory. Such instructions may be received by the controller from another computer, a computer readable medium, or a network connection.

Stored on any one or on a combination of computer readable media, the present invention includes software for controlling the processing system 205, exhaust system, 210, gas supply system 260, and a controller 290, for driving a device or devices for implementing the invention, and for enabling one or more of the system components to interact with a human user and/or another system. Such software may include, but is not limited to, device drivers, operating systems, development tools, and applications software. Such computer readable media further includes the computer program product of the present invention for performing all or a portion (if processing is distributed) of the processing performed in implementing the invention.

Controller 290 can comprise a GUI component (not shown) and/or a database component (not shown). In alternate embodiments, the GUI component and/or the database component are not required. The user interfaces for the system can be web-enabled, and can provide system status and alarm status displays. For example, a GUI component (not shown) can provide easy to use interfaces that enable users to: view status; create and edit charts; view alarm data; configure data collection applications; configure data analysis applications; examine historical data, and review current data; generate e-mail warnings; view/create/edit/execute dynamic and/or static models; view diagnostics screens; and view/create/edit BIST tables in order to more efficiently troubleshoot, diagnose, and report problems.

During a process, the controller 290 can cause one or more process parameters to change form one value to another value. A real-time dynamic model can be established for this particular system configuration based on the type of vertical wafer boat 223, the type, position, and quantity of wafers W, the type of thermal processing chamber 202, and the recipe to be performed.

The real-time dynamic pressure model can be executed to generate a predicted dynamic pressure response for the processing chamber during the process. In addition, a measured dynamic pressure response can be created for the processing chamber during the process, and a dynamic estimation error can be determined using a difference between the predicted dynamic response and the measured dynamic response. Furthermore, the dynamic estimation error can be compared to operational limits established for one or more BIST rules in a BIST table. The process can be stopped when the dynamic estimation error is not within operational limits established for at least one of the BIST rules in a BIST table, and the process can continue when the dynamic estimation error is within operational limits established for at least one of the BIST rules in a BIST table.

During operation, the temperatures of wafers W in the respective zones are estimated, and adaptive methods are used to control the heater stages 231-235 so that the corrected wafer temperatures can be equal to temperatures indicated by the recipe. When the temperature increase is completed, the adaptive control is used to retain the temperatures of the respective zones. Techniques for controlling a heating apparatus using models are disclosed in U.S. Pat. No. 6,803,548, entitled "Batch-type Heat Treatment Apparatus and Control Method for the Batch-type Heat Treatment Apparatus, which is incorporated by reference herein.

Controller 290 can also create a measured static and/or dynamic response using data from the inner temperature sensors 251-255, the outer temperature sensors 261-265, the electric power controllers 236-240, the pressure adjuster 228, or the flow rate adjusters 244-246, or a combination thereof.

Figure 3:
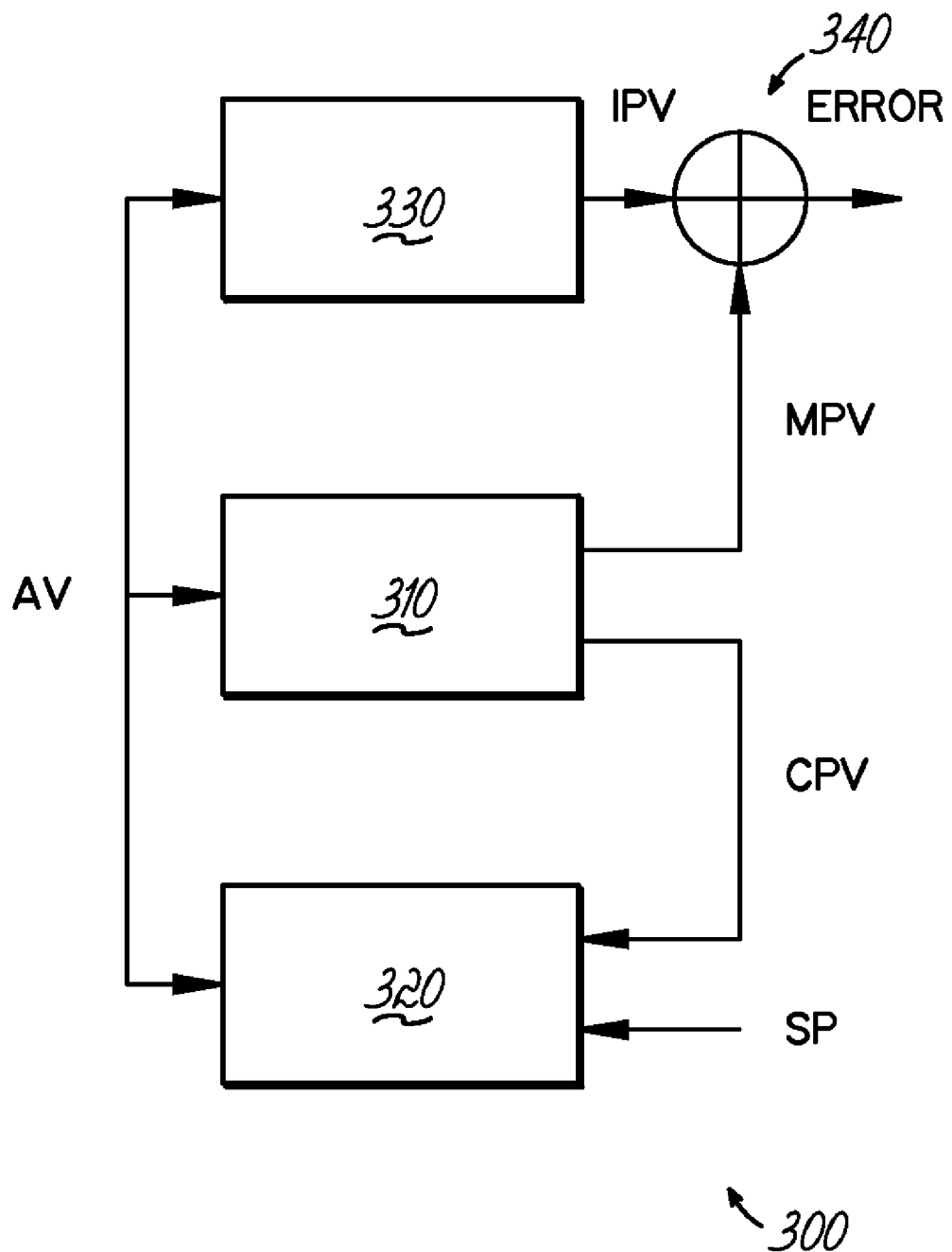
FIG. 3 illustrates a simplified block diagram of a processing system in accordance with embodiments of the invention.

FIG. 3 illustrates a simplified block diagram of a processing system in accordance with embodiments of the invention. In the illustrated embodiment, a processing system 300 is shown that comprises a system 310, a controller 320, a dynamic model 330, and a comparator 340. In addition, actuation variables (AV) are shown, and these are the variables that have a fixed setpoint (SP) in the recipe or are generated in real-time by the controller 320 based on a setpoint in the recipe. For example, heater power, mass flow rate, and exhaust valve angle.

Two types of process variables (PV) are illustrated, and these are process conditions in the equipment as a result of the actuation variables (AV). Examples of process variables (PV) include chamber or wafer temperatures, chamber chemistry, reactant concentration at the wafers, and film thickness on the wafer. The process variables (PV) can be classified as measured process variables (MPV) that are measured using sensors and general process variables (GPV) that are not measured by sensors. Of the ones that are measured, some can be directly controlled via the controller 320—these are controlled process variables (CPV).

The AV, MPV, and SP are available in real-time. By definition, the GPV are not available (not measured); their effect may be deduced only by end-of-run measurements. For example, in a batch processing chamber, real-time data is available for chamber pressure, mass flow rates and their setpoints, valve angles, and chamber temperature for each zone.

During system operation, error conditions can occur. For example, the types of error conditions can include a component failure, where an active, passive, or software component fails to perform a required task; a component degradation, where the performance of an active, passive, or software component is degraded, and a failure can occur in the near future if the degraded performance is not corrected; and a configurations error, where an active, passive, or software component is not configured properly.

The processing system and/or the system components can be in one of two states when operational, a processing state in which the system and/or the system components are processing wafers and/or wafers; and an idle state in which the system and/or one or more of the system components are waiting to process wafers and/or substrates. In an alternate embodiment, a maintenance state may also be used in which the system and/or one or more of the system components is off-line for a maintenance, calibration, and/or repair time.

These two states provide unique opportunities to perform operations for creating and/or modifying a BIST table. In the passive mode, during the processing state, one or more of the processes can "observe" the real-time system response, but cannot make changes to the processing conditions. For example, the system response can be observed, and processing conditions and error conditions can be determined. In addition, dynamic and/or static models can be executed, and the BIST rules, the operational conditions, operational limits, and tolerance values in a BIST table can be verified. In addition, new BIST rules, new operational conditions, new operational limits, and/or new tolerance values can be created and stored in a BIST table.

In the idle mode, one or more of the processes can make changes to the processing conditions since no product wafers are being processed. During the idle mode, one or more of the processes can create processing conditions as necessary to detect and diagnose degradations and fault conditions. These degradations and fault conditions can be used to create and/or modify the BIST rues, the operational conditions, the operational limits, and/or the tolerance values in a BIST table. In particular, one or more of the processes may select process parameters to magnify an error condition, rather than to hide or compensate for it. In the idle mode, the system can be operated using production conditions, or the system can be operated using non-production conditions (e.g., no wafers in the chamber, no reactant gases flowing, etc.) In addition, one level of tests can be conducted at the component level, and these tests can also be static or dynamic. For example, heater resistance can be monitored for signs of any degradation.

Static measurements are one way to detect errors. However, drift and degradation may be small for multiple parameters, but they have an overall impact on system performance.

The system dynamic performance is a composite picture of the system parameters that can be dependent on a number of variables. For example, a system response can be a function of an active, passive, or software component.

Deviation in one or more of these components can lead to errors. For better detection and diagnosis, a "system level" approach can be used.

Recipes can be used in a system level, and a typical recipe provides the setpoints (SP) for the measured process variables (MPV), including the controlled process variables (CPV), and the system controller can control the actuation variables (AV) to reduce the error between the CPV and SP, where the Error=SP−CPV.

In addition, rules can be used to specify an acceptable range of the CPV during certain critical steps. An alarm is generated if the CPV goes out of this range. For example:

CPV−Lower Bound (LB)>Alarm Operational limit   (1)

Upper Bound (UB)−CPV>Alarm Operational limit   (2)

However, this approach only determines the controllers "ability" to keep the error small—it does not determine if the equipment is functioning properly. In particular, it does not address what is happening with the general process variables, and hence, the end-of-run parameters.

In one embodiment, the BIST tables can be used to determine if the system and/or the system components are behaving "as-designed" from the real-time data and dynamic models of the system components. Dynamic models provide the response of the system "as designed," and can be used for detecting error conditions. For example, an error can be computed using the difference between the modeled response (IPV) and the measured response as shown below:

Error=IPV−MPV

A warning and/or fault can be created if this error is greater than pre-set operational limits. The BIST table can include BIST rules, operational conditions, operational limits, and tolerance values.

In an "active mode", procedures based on the data in BIST tables can be used to create conditions to magnify the error between the modeled response and measured response in the appropriate regime of the PV. In such dynamic conditions, variation between the modeled and measured is amplified. Under static or steady conditions, the errors can appear as "bias" errors and can be swamped by measurement noise. Active mode can significantly increase the probability of true alarms.

For example, for a processing system, the models used for BIST tables can be related to various real-time data sets collected from the system; these include setpoints, MFC flow rates, pressure measurements from the 0-10 Torr and 0-1000 Torr gauges, valve angle, temperature data, and pressure control parameters.

The models include both dynamic (transient) and steady-state behavior. For example, dynamic behavior models pressure rise rate. To describe the mathematical model further, notation shown in Table 1 can be used:

TABLE 1

| Parameter | Description |
| --- | --- |
| $p_i$ | $i^{th}$ MFC gas flow rate (sccm) |
| v | Valve angle opening (%) |
| $P_c$ | Chamber pressure (mTorr) |

The rate of change for chamber pressure $\dot{P}_c$ as a function $f$ of gas flows and valve angle can be modeled as follows:

$$\dot{P}_c = f_1(p_1, p_2, \ldots, p_n, v)$$

A special condition exists when the valve is fully closed—in this case, the pressure rise rate becomes independent of the pressure controller. For this condition, the chamber pressure rise rate $\dot{P}_c$ can be:

$$\dot{P}_c = f_1(p_1, p_2, \ldots, p_n, v=0)$$

Given this model, one method for individually estimating MFC flow rates is to use an inverse function:

$$p_i = f_1^{-1}(\dot{P}_c)$$

In addition, the steady-state behavior can be modeled as follows:

$$P_c = g_1(p_1, p_2, \ldots, p_n, v)$$

This model can be used to estimate a parameter given the rest of the parameters, that is:

$$p_i = g_1^{-1}(P_c, v)$$

$$v = g_1^{-1}(p_1, p_2, \ldots, p_n, P_c), \text{ and}$$

$$P_c = g_1(p_1, p_2, \ldots, p_n, v)$$

Thus, these models provide multiple estimates of the process parameters for a number of different operational conditions. The inference logic can be used to examine the estimated parameters to generate diagnostics based on the BIST rules, the operational conditions, and/or operational limits in a BIST table.

In one embodiment, a method can be established to capture the dynamic and steady-state behavior of the gas-flow system coupled to the processing system. The method involves running a "model-development" recipe on the processing system and/or system components. The recipe is designed to operate under a variety of conditions, as follows:

1) system dynamic response under automatic pressure control (APC);
2) system dynamic and steady-state response under manual valve control (MVC);
3) base pressure with valve fully open; and
4) leak rate with valve fully closed.

In the set of tests to determine the system response under APC, the pressure setpoint can be changed, and the change in chamber pressure for various gas flow rates can be analyzed. For example, the following changes can be made:

1) Step change in pressure setpoint from zero to 3 Torr,
2) Step change from 3 to 6 Torr, and
3) Step change from 6 to 9 Torr.

Figure 4:
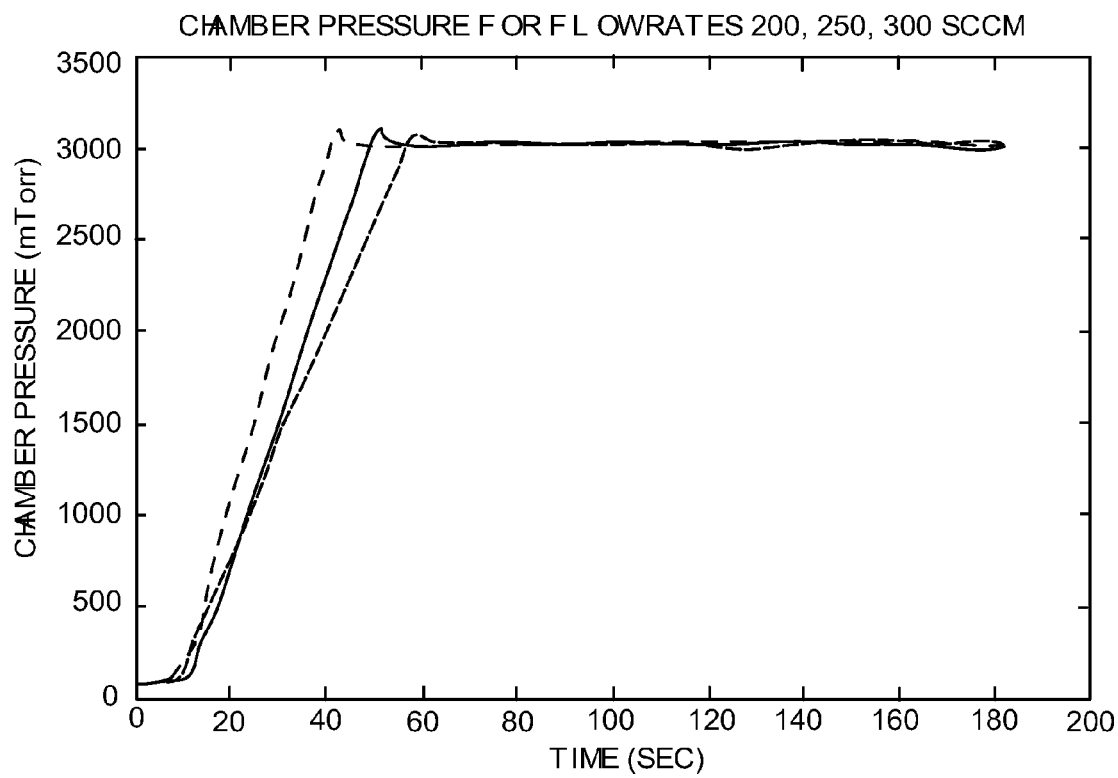
FIG. 4 shows the chamber pressure transient behavior for a first pressure setpoint change in accordance with embodiments of the invention.
Figure 5:
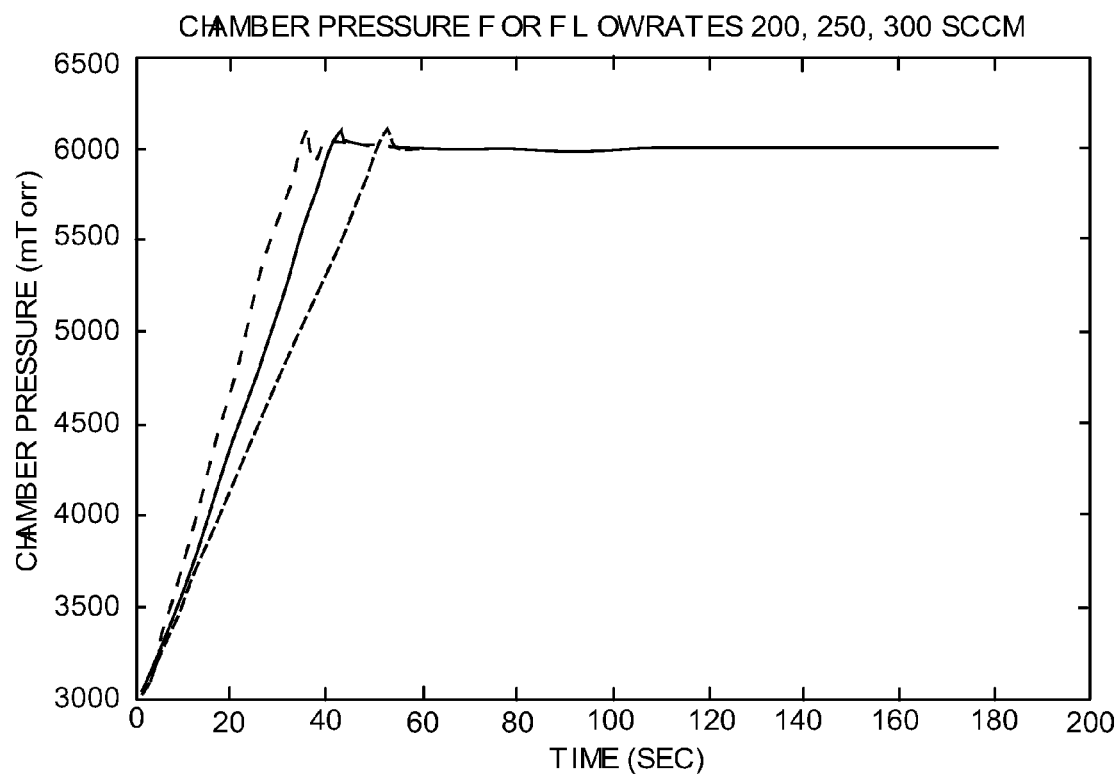
FIG. 5 shows the chamber pressure transient behavior for a second pressure setpoint change in accordance with embodiments of the invention.
Figure 6:
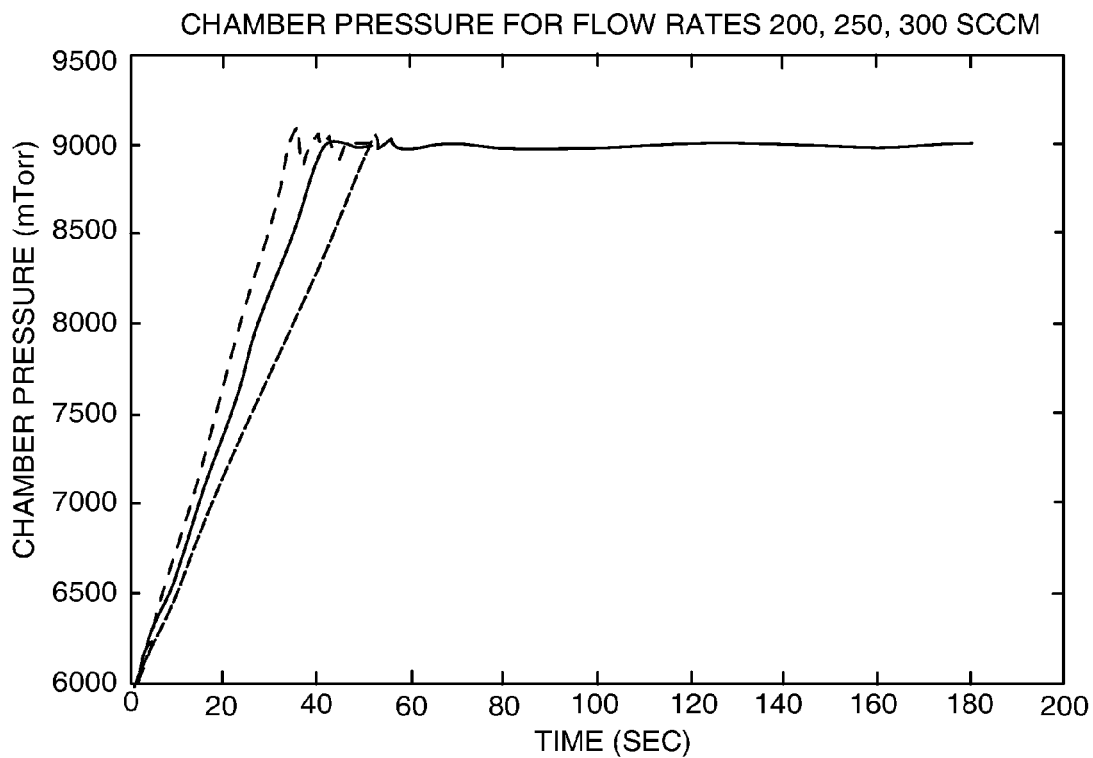
FIG. 6 shows the chamber pressure transient behavior for a third pressure setpoint change in accordance with embodiments of the invention.

When the pressure setpoint is changed, from 0 to 3 Torr, the pressure controller manipulates the main valve opening to achieve the target pressure. Initially, the controller action completely shuts the valve. Under these conditions, the pressure rise rate also becomes a function of gas flow rate, and is independent of the valve angle. Exemplary results are shown in FIG. 4, FIG. 5, and FIG. 6. FIG. 4 shows the chamber pressure transient behavior for a pressure setpoint change from 0 to 3 Torr. FIG. 5 shows the chamber pressure transient behavior for a pressure setpoint change from 3 to 6 Torr. FIG. 6 shows the chamber pressure transient behavior for a pressure setpoint change from 6 to 9 Torr.

There are three sets of data—for each pressure step response, the pressure rise rate is measured for a 200, 250, and 300 sccm gas flow rate. This data can be used to obtain a consistent mathematical model of pressure rise rate vs. gas flow rate. For example, a linear relationship can be used:

$$y = ax + b,$$

where y=pressure rise rate (mTorr/sec) and x=gas flow rate (sccm). A linear least square fit yielded the results in Table 2.

TABLE 2

| Test case | Parameter "a" | Parameter "b" |
|---|---|---|
| 0 to 3 Torr | 0.292 | −1.4 |
| 3 to 6 Torr | 0.288 | −0.25 |
| 6 to 9 Torr | 0.289 | −0.47 |

Figure 7:
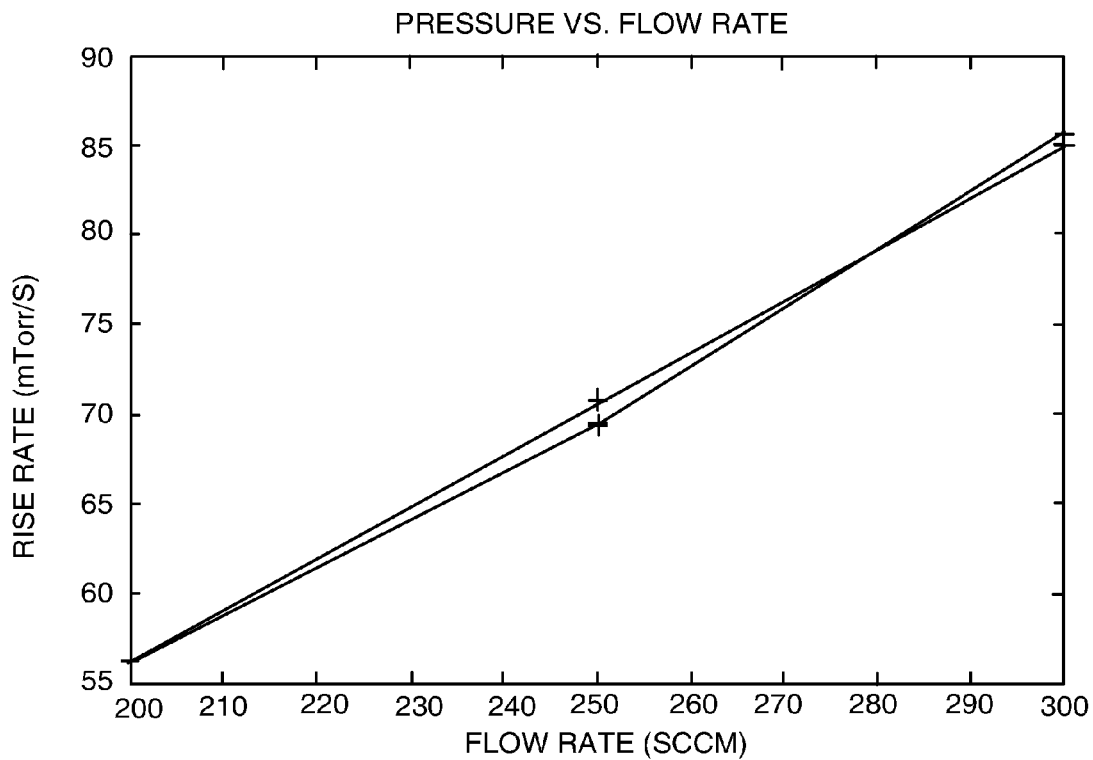
FIG. 7 shows rise rate as a function of gas flow rate for the three step response test cases in accordance with embodiments of the invention.

These results are also shown in FIG. 7 in which the rise rate is shown as a function of gas flow rate for the three step response test cases.

The parameter "b" should be ideally equal to zero—when there is no gas flow, the pressure rise rate should be zero. The measured value is a very small number around 1 sccm. The main parameter is "a". It is clear from the data in Table 2 that in this operating regime, the pressure rise rate can be modeled with a single set of parameters "a" and "b", independent of the gas flow rate, and this is one of the sub-models used in the software for a BIST table. For example, the measured pressure rise rate is approximately equal to 75 mTorr/sec when the estimated gas flow rate is approximately equal to 258.6 sccm.

The system response under MVC can be determined, and a relationship of steady state pressure $P_c$ as a function of gas flows and valve angle can be obtained using:

$$P_c = g_1(p_1, p_2, \ldots, p_n, v)$$

Figure 8:
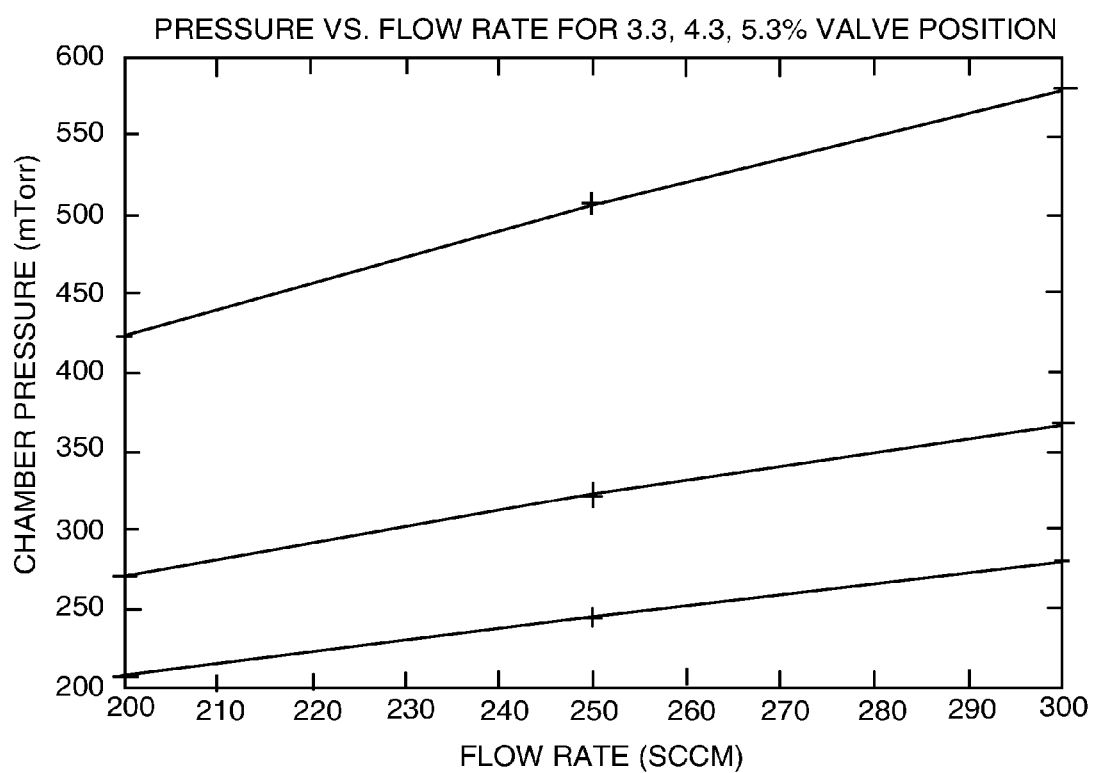
FIG. 8 shows chamber pressure as a function of flow rates at various valve angles in accordance with embodiments of the invention.

This function is expected to be quite nonlinear (unlike the linear function obtained for the pressure rise rate). In one case, specific values of this function can be empirically obtained under the following combination of conditions: for MFC flow rates of 200, 250, and 300 sccm and valve angles of 3.3, 4.3, and 5.3%. For example, the values obtained on one system are shown in Table 3, and the chamber pressure as a function of flow rates at various valve angles is illustrated in FIG. 8.

TABLE 3

|  | 3.3% | 4.3% | 5.3% |
|---|---|---|---|
| 200 | 423 | 270 | 206 |
| 250 | 506 | 321 | 244 |
| 300 | 578 | 367 | 279 |

In one embodiment, a real-time estimator methodology can be used. Alternatively, other methods may be used. The semiconductor processing system and/or one or more of the system components or subsystem components can be modeled using a set of nonlinear differential equations $\dot{x}$ and an output equation y as follows:

$$\dot{x} = f(x, p, u) + w$$

$$y = g(x, p, u) + v$$

where: x is the state vector which can consist of temperatures, pressures, and reactant states; the vector p consists of model parameters, such as heat capacity, thermal conductivity, and rate constants; the vector u consists of input applied to the process, such as heater powers; w is the additive white noise with zero mean, $E(w)=0$ ($E(\cdot)$ denotes the expectation operator), v is the additive white noise with zero mean, and $E(v)=0$.

Given the initial state $x_0$, input u, and parameters p, the differential equations can be integrated to compute the evolution of the state.

In addition, the models can be linearized for real-time applications. The linearization may lead to one or a set of models that describe the dynamics of the system along a nominal trajectory. These linear models are represented in state-space form by matrices $A_i$, $B_i$, and $C_i$ for each ith time interval. Thus, the nonlinear models are replaced by a sequence of discrete-time linear models:

$$x_{k+1} = A_i x_k + B_i u_k + w_k$$

$$y_k = C_i x_k + v_k$$

where k is a time index. The covariance of the initial state $P_0$ is $E\{x_0 x_0^T\} = P_0$, where T is the transposition operator.

A convenient method to build a real-time estimator is using Kalman filters matrices, $L_i$, which gives:

$$\hat{x}_{k+1} = A_i \hat{x}_k + B_i u_k + L_i(y - C_i \hat{x})$$

$$\hat{y}_k = C \hat{x}_k + v_k$$

where ^ indicates an estimated value.

When performing a steady-state check, the dynamic model of the system (without the noise terms) can be used, and the set of nonlinear differential equations $\dot{x}$ and an output equation y can be as follows:

$$\dot{x} = f(x, p, u)$$

$$y = g(x, p, u)$$

At some steady state, $\dot{x}=0$, and the steady-state values for the state, input, and output will be $x_s$, $u_s$, and $y_s$ respectively. Using known steady state values of the input and output for a reference system (e.g., $u_{ref}$ and $y_{ref}$) the steady-state values for any given system can be monitored and compared to the reference. In particular, if the feedback controller drives the system output to $Y_{ref}$, the value of $u_s$ can be checked; that is:

Drive the outputs to the reference value $y_s \rightarrow y_{ref}$, and hence $\|y_s - y_{ref}\| \leq \epsilon$ Check the inputs to the reference value
Is $\|u_s u_{ref}\| \leq \epsilon$?

$\epsilon$ is selected to be a sufficiently small value for the particular system.

If the difference is small, then the system under test (SUT) is operating like the reference system; otherwise, a possibility of an error condition is indicated.

As a first example, consider a thermal processing chamber with five zones; suppose on the thermal processing chamber it has been determined that when all the zones are at 600° C., the heater power should be as shown in Table 4.

TABLE 4

| Zone | Power (W) |
|---|---|
| 1 | 1200 |
| 2 | 1300 |
| 3 | 1400 |
| 4 | 1400 |
| 5 | 1300 |

When a thermal processing chamber at the same five 600° C. temperature zones is reporting a heater power of 2600 W in zone 5, it is clear that some sort of error condition is indicated—the error condition could be with the heater zone, o-rings, etc., and must be diagnosed with further tests.

In one embodiment, a dynamic response check can be performed. As described herein, one way to detect error is to monitor the dynamic response of the system and compare it to the reference. For example, a dynamic real-time estimator can be used for this purpose. Consider a linear estimator created with the reference system, where the estimates of the output are given by:

$$\hat{y}_k = C\hat{x}_k + v_k$$

When the SUT is producing outputs $y_k$, a check can be performed to determine if the two are close enough:

Check the *SUT* output with estimates of reference system

Is $\sum_{i=1}^{n} |y_k - \hat{y}_k|$ reasonably small?

Thus, these models provide multiple estimates of the process parameters. The inference logic can be used to examine the estimated parameters to generate diagnostics based on the BIST rules, the operational conditions, and operational limits in the BIST table.

As a second example, when examining low-pressure processes, a monolayer deposition (MLD) process recipe can be used. An exemplary MLD process recipe is shown in Table 5. Note that the process parameters of the recipe are selected for illustrative purposes only.

The steps of the recipe shown below focus on the portion of the recipe used to create a monolayer of the desired film on the wafer(s). This portion is repeated several times to achieve desired film thickness. For example, a recipe may call for 100 repetitions of such a sub-cycle. Reduction in process time for each such cycle can lead to substantial saving in overall cycle time.

TABLE 5

| Step # | Name | Time (sec) | Temp (deg C.) | Pressure (Torr) | Back $G_I$ (sccm) | $R_A$ ($G_I$) (sccm) | $R_B$ ($G_I$) (sccm) |
|---|---|---|---|---|---|---|---|
| 1 | $R_A$ Step | 150 | 500 | 1 | 100 | 250 | (100) |
| 2 | Purge 11 | 90 | 500 | MV Open | 100 | (100) | (2000) |
| 3 | Purge 12 | 30 | 500 | 1 | 100 | (100) | (1000) |
| 4 | $R_B$ Step | 150 | 500 | 1 | 100 | (100) | 100 |
| 5 | Purge 21 | 90 | 500 | MV Open | 100 | (100) | (2000) |
| 6 | Purge 22 | 30 | 500 | 1 | 100 | (100) | (1000) |

In one set of operational conditions, the chamber can be evacuated to a low pressure of one Torr, and this can be followed by a repetition of gas flow steps including precursor gases and purging gasses. During the $R_A$ step shown in Table 2, the setpoint of the $R_A$ MFC is set to 250 sccm and held at this value for 150 sec. During this time, the pressure controller is active with a setpoint of one Torr. In the next step, the $R_A$ MFC is closed, the $G_I$ MFC is set to 2000 sccm, and the main exhaust valve is opened. Likewise, for the $R_B$ step, the setpoint of the $R_B$ MFC is set to 100 sccm and held at that value for 150 sec. The second purge step is similar to the first purge step.

In one embodiment, the present invention provides a controller operating in real-time that includes hardware, software, and BIST applications for monitoring the following process parameters and their associated system components: pressure setpoints (mTorr), actual chamber pressures (mTorr), valve angle setpoints, actual valve angles (%), reactant MFC setpoints (sccm), other MFC setpoints (sccm), inert gas flow MFC setpoints (sccm), temperature setpoints (° C.), actual temperatures (° C.), processing times (secs), actual times (secs), valve positions, reactant concentrations, chamber chemistry, and wafer position.

In a simplified procedure, the methodology can be described as the following: first, the chamber is purged of the reactants by flowing $N_2$ through the reactant MFCs. The main exhaust valve is opened for a period of time and then, the main exhaust valve is closed and the reactant flow is turned on. The reactant MFC setpoint is set to the desired flow value. Based on the set flow rate—the chamber pressure is expected to rise at a given rate—based on the MFC setpoint. The valve can remain closed for a certain duration, and then, the valve can respond to the setpoint on the chamber pressure under automatic pressure control.

In a simplified example, a simplified model of a thermal processing chamber can be created that relates a first process parameter, such as Gas Flow Rate (GFR), to the rate of change of a second process parameter, such as a Pressure Rise Rate (PRR). Then, for any given process recipe step while and/or after a reactant gas flow is introduced, a Measured Pressure Rise Rate (MPRR) can be obtained by monitoring the real-time process parameters. Next, using the MPRR and the model described above, a Measured Gas Flow Rate (MGFR) can be calculated. Then, the MGFR can be compared to the Expected Gas Flow Rate (EGFR)—this expected gas flow rate can be the setpoint in the recipe. If there is a mismatch between the MGFR and EGFR, then a degraded process condition can be expected. The severity of mismatch can be used to establish warning or fault conditions.

In one embodiment, the present invention provides a method for monitoring the dynamic and steady-state behavior of the processing system and associated gas-flow system. The method involves running a "model-development" recipe on the processing system—the recipe is designed to operate under a variety of condition in order to produce a number of new BIST rules, new operational conditions, new operational limits, and/or new tolerance values in a BIST table. Alternatively, other processing systems may be monitored.

Requirements for the processing of wafers can include tight critical dimension (CD) control, tight profile control, and tight uniformity control—both wafer-in-wafer and wafer-to-wafer. In addition, film thickness and file uniformity can be critical. For example, variations in CD measurements, profile measurements, and film uniformity measurements may be caused by variations in thermal profile across wafer zones and variations in thermal response from wafer to wafer.

Typically, bare silicon wafers are relatively flat and are manufactured within tight specifications. However, multiple films are deposited on wafers during multiple thermal processes, and as a result, wafers can acquire significant curvature. Wafer curvature can have an adverse impact on film uniformity and/or CD uniformity by creating problems during processing, including a deposition process.

A BIST table can be used to detect wafer position errors and reject a wafer when it has excess curvature. Real-time data from one or more measurement devices can be used in a "mathematical model" to estimate and/or compensate for wafer curvature, and the model can be static or dynamic, linear or nonlinear.

In one embodiment, the monitoring system uses the dynamic response of the chamber as flat and/or warped wafers are positioned within and/or processed in the thermal processing chamber to detect, diagnose, and/or predict system performance. For example, wafers with different curvatures create different dynamic thermal responses when they are positioned within and/or processed in the thermal processing chamber.

In addition, other embodiments can be designed for both real-time and non-real-time comparisons. In a real-time method, system performance can be estimated and monitored in real time during processing of the wafer. In a non-real-time method, the data can be processed at a later time, and the system performance can be estimated and monitored after one or more of the wafers have been processed. In other embodiments, virtual sensors can be used to "measure" wafer temperatures in real-time and eliminate the need for instrumented wafers during production. For example, a virtual sensor can comprise a dynamic model component or a real-time model, a physical sensor component that measures a physical variable such as temperature, a manipulated variables component that regulates a variable such as applied voltage or power to the heater, and a software algorithm component that relates the dynamic model component in conjunction with information from the physical sensors and the manipulated variables. The virtual sensor may be viewed as a compound device comprising an algorithm-based consolidation of information from multiple "physical" sensors. The virtual sensor is an adaptive device that can provide historical data, real-time data, and predictive data.

Figure 9:
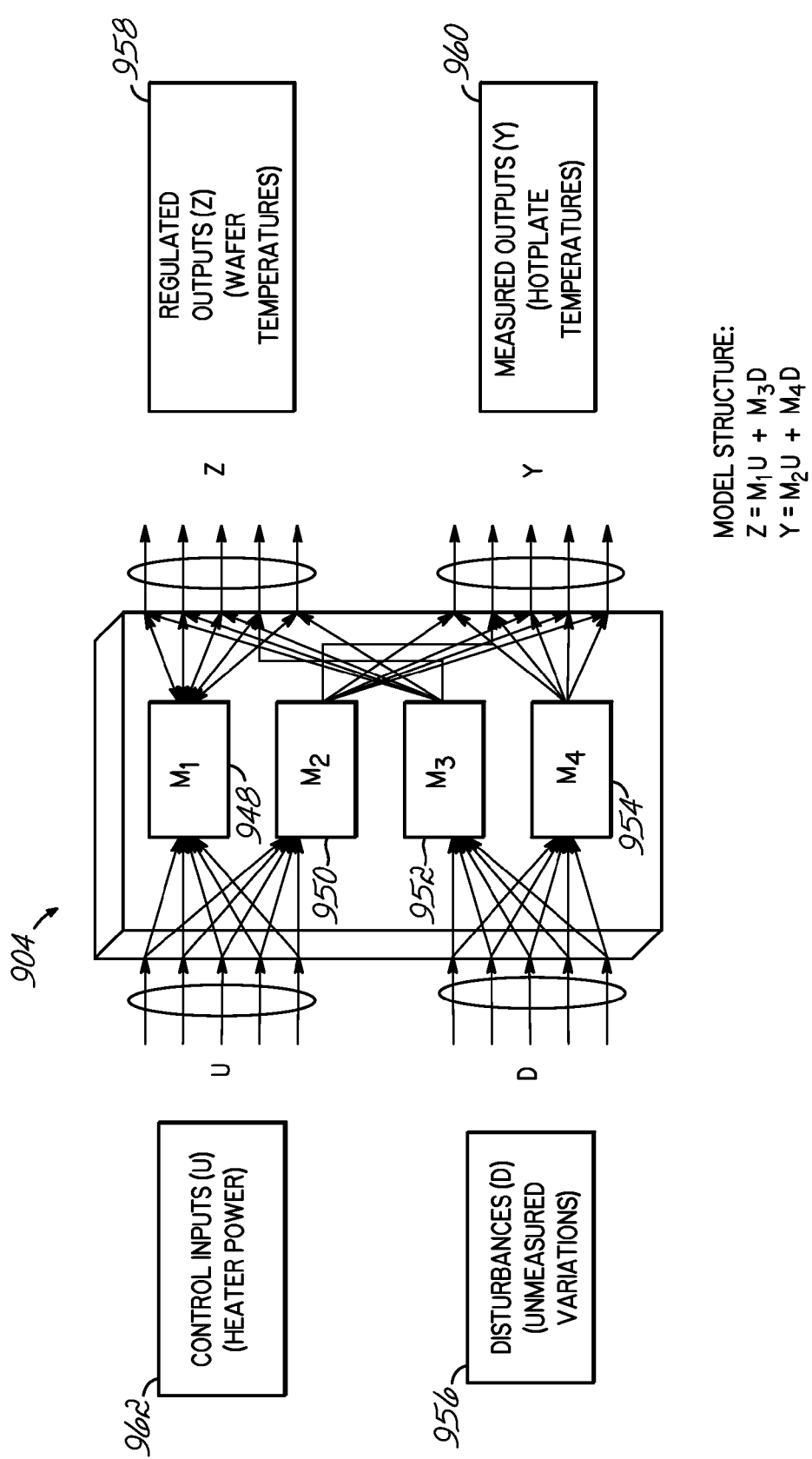
FIG. 9 illustrates a schematic representation of an embodiment of the dynamic model characterizing one or more of the responses of a processing system in accordance with an embodiment of the invention.

FIG. 9 illustrates a schematic representation of an embodiment of the dynamic model 904 characterizing one or more of the responses of a processing system in accordance with an embodiment of the invention. In the illustrated embodiment, four nodes or model components ($M_1$, $M_2$, $M_3$, and $M_4$) 948, 950, 952, 954 are shown. However, in alternative embodiments of the invention, a different number of model components may be used, and the model components may be arranged with a different architecture.

In addition, the dynamic model 904 receives control inputs (U) 962, such as heater power, chamber pressure, gas flow, and wafer information. The model also receives disturbance inputs (D) 956, such as unmeasured variations. The model determines regulated outputs (Z) 958, such as wafer temperatures, and measured outputs (Y) 960, such as chamber temperatures. The model structure may be expressed as $Z=M_1U+M_3D$ and $Y=M_2U+M_4D$. Alternatively, a different expression for the model structure may be used.

The dynamic model 904 tracks the "state" of the system, and relates the inputs 962 to outputs 958, 960 in real-time. For example, U and Y may be measured, and by using the dynamic model 904, D may be estimated using $Y=M_2U+M_4D_{est}$ and Z may be estimated using $Z_{est}=M_1U+M_3D_{est}$.

When creating the dynamic model 904, wafer position, wafer curvature, and chamber effects may be incorporated into the model. For example, dynamic models 904 can be created using first principles models based on heat transfer, gas flow, and reaction kinetics, or on-line models created with real-time data collected from a processing system, such as a thermal processing system and/or MLD system.

During model development, a first principles model may be implemented numerically on a suitable microprocessor in a suitable software simulation application, such as Matlab. The software application resides on a suitable electronic computer or microprocessor, which is operated so as to perform the physical performance approximation. However, other numerical methods are contemplated by the present invention.

A model-based linear or nonlinear multivariable control approach may be used to model the thermal doses in which the controller comprises a mathematical model of the system to be controlled. The multivariable controller may be based on any of the modern control design methods such as linear-quadratic-gaussian (LQG) method, linear quadratic regulator (LQR) method, H-infinity (H-inf) method, etc. The thermal dose model may be either linear or nonlinear and either SISO or MIMO. The multivariable control approach (i.e., MIMO) considers all inputs and their effects on the outputs. Several other approaches for modeling the thermal doses are available, such as physical models, and data-driven models.

Figure 10:
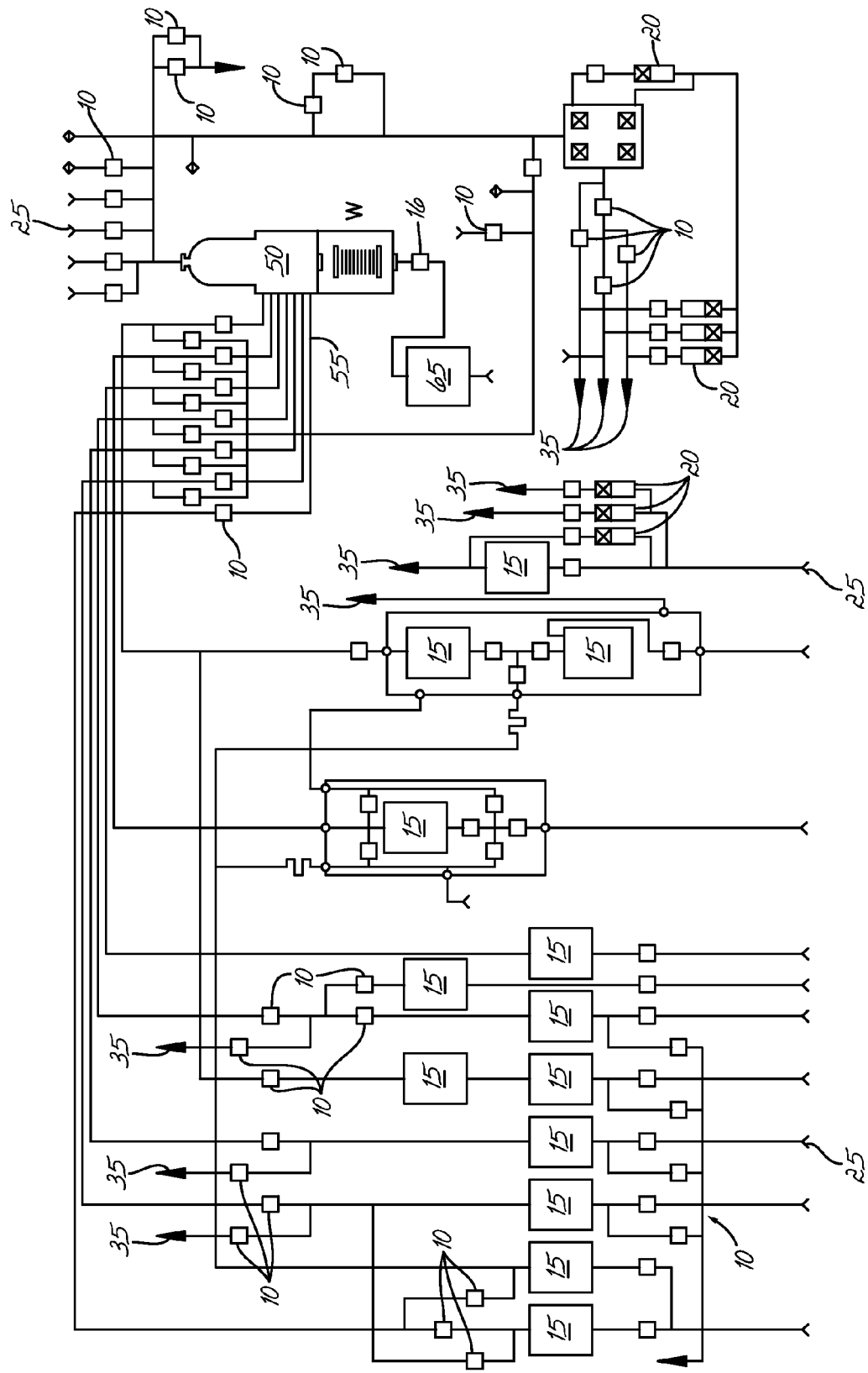
FIG. 10 illustrates a simplified schematic drawing for a processing system in accordance with embodiments of the invention.

FIG. 10 illustrates a simplified schematic drawing for a semiconductor processing system in accordance with embodiments of the invention. In one embodiment, the processing equipment used in low-pressure processing can include a processing chamber and gas flow system to create desired gas flow conditions in the processing chamber. In the illustrated embodiment, a simplified schematic view of a TELFORMULA® System from Tokyo Electron Limited is shown that includes a number of components that enable both atmospheric and low-pressure operation, with a variety of gas species.

In the illustrated embodiment, a gas supply system is shown that includes mass flow controllers (MFC) 15, mass flow meters (MFM) 20, inputs 25, outputs 35, supply lines 55, and interlock valves 10. Alternatively, a different configuration may be used.

A process chamber 50 is shown that can process a number of wafers W. Alternatively, a different configuration may be used. In addition, an exhaust system 65 is shown that includes a pressure controller 16. Alternatively, a different configuration may be used.

For example, a system may contain the following:
1) Gas supply system: This system can include one or more $N_2$ lines as well as the required process gas lines. For example, a gas line, such as a silane gas line, can contain the following:
    a) $SiH_4$ line with:
        i) Check valve: HV3
        ii) Pressure test point: PT3
    b) $N_2$ bypass line with:
        i) Check valve: HV2
        ii) Pressure test point: PT2
    c) Mass flow meter: MFM1
    d) Mass flow controller: MFC5
    e) Isolation valves: V8 and V9
    f) Chamber isolation valve: HV7
2) Exhaust system: The exhaust system can include one or more of the following:
    a) Main valve: MV, and slow valves: SV and SSV
    b) Automatic pressure controller: APC
    c) Vacuum gauge: VG5, ~100 Torr
    d) Vacuum gauge: VG2, ~1000 Torr
3) Process chamber: The process chamber can include one or more of the following:
    a) Vacuum gauge: VG1, 0~10 Torr
    b) Pirani gauge: VG3

In one embodiment, BIST rules can be created for gas supply system components, for exhaust system components, for chamber components, for temperature control components, for wafer transfer components, and/or other system components.

Figure 11:
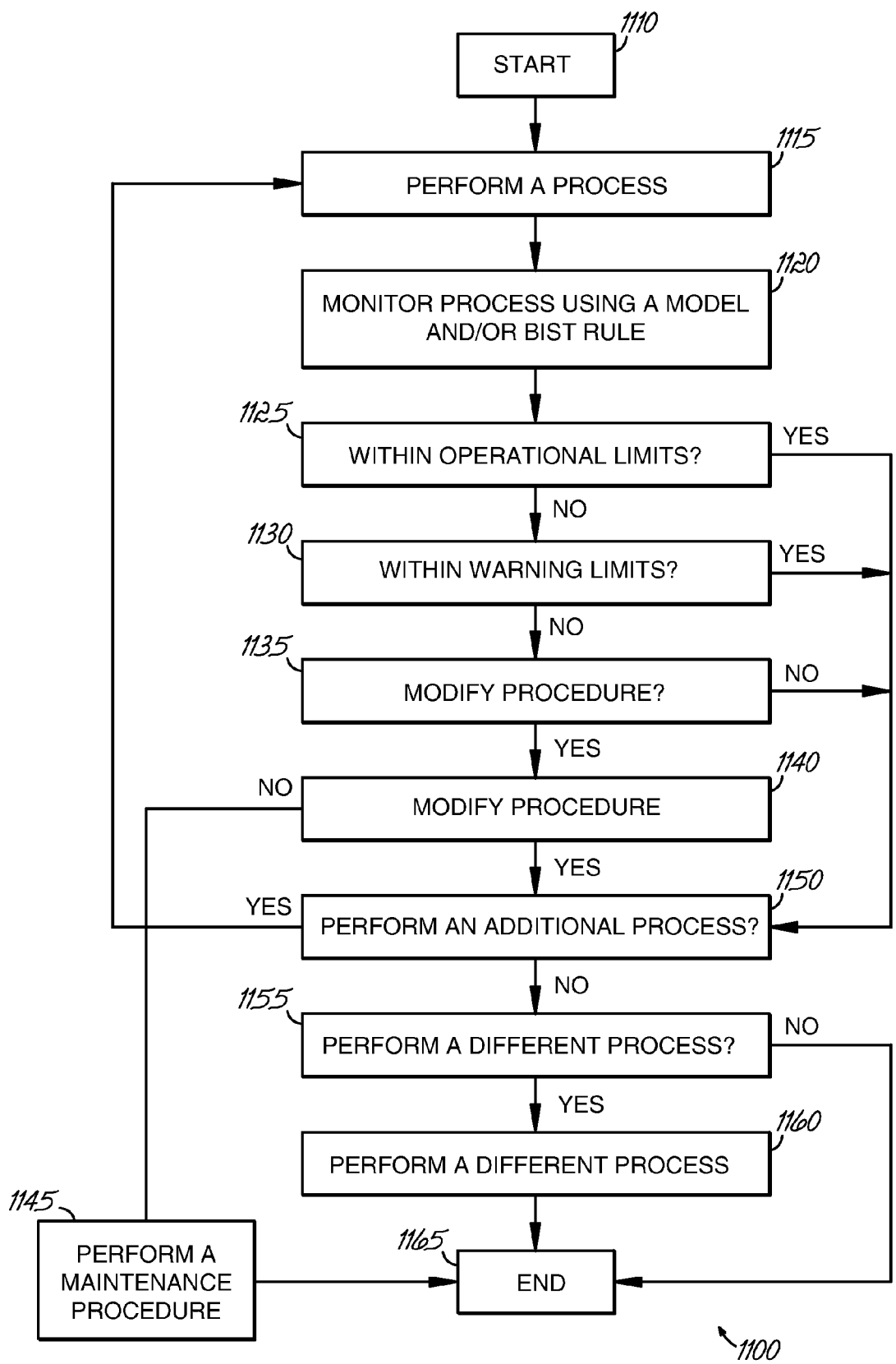
FIG. 11 illustrates a simplified flow diagram of a method of monitoring a processing system in real-time using one or more process models in accordance with embodiments of the invention.

FIG. 11 illustrates a simplified flow diagram of a method of monitoring a processing system in real-time using one or more process models in accordance with embodiments of the invention. A number of process models can be created for a processing system that can includes temperature control components, pressure control components, gas supply components, controller components, measurement components that can include physical and/or virtual sensors, mechanical components, computing components, or software components, or combinations thereof. Procedure 1100 can start in 1110.

In 1115, one or more processes can be performed on one or more wafers positioned in a processing chamber in a processing system. In one embodiment, the one or more wafers can be transferred into the chamber and the chamber can be sealed. In various embodiments, the one or more wafers can include a production wafer, an instrumented wafer, a test wafer, or a dummy wafer, or can be a lot that includes a combination thereof. In some cases, a plurality of wafers may be positioned at different heights in the processing chamber, and the processing chamber can be sealed. For example, a vertical boat can be used to position the wafers in a thermal processing chamber.

Prior to performing a process, pre-processing conditions can be established. For example, chamber pressure, chamber temperature, wafer temperature, and/or process gas conditions can be changed to pre-processing before a process is performed. In some cases, the pre-processing values may be equal to operational values.

A processing system can obtain data and can use the data to determine the operational conditions that are required before, during, and/or after a process is performed. In addition, the data can include dynamic and/or static modeling information for predicting the performance of the processing system before, during, and/or after the process is performed. Furthermore, the data can include measured and/or predicted data from previous processes.

In addition, the data can include feedforward data, feedback data, recipe data, historical data, wafer state data, such as critical dimension (CD) data, profile data, thickness data, uniformity data, and optical data, such as refractive index (n) data and extinction coefficient (k) data. Wafer state data can also include the number of layers, layer position, layer composition, layer uniformity, layer density, and layer thickness. Layers can include semiconductor material, resist material, dielectric material, and/or metallic material. In addition, data can comprise correction data, error data, measurement data, or prediction data, or a combination of two or more thereof.

Referring again to FIG. 11, in 1120, the process can be monitored in real time using at least one process model and at least one BIST rule. The process model can be created using a set of nonlinear differential equations $\dot{x}_1$ and an output equation $y_1$, as follows:

$$\dot{x}_1 = f(x_1, p_1, u_1) + w_1$$

$$y_1 = g(x_1, p_1, u_1) + v_1$$

wherein the vector $x_1$ comprises a state vector, the vector $p_1$ comprises one or more modeling parameters, the vector $u_1$ comprises one or more inputs applied to the process, $w_1$ is a first additive white noise value having a zero mean, and $v_1$ is a second additive white noise value having a zero mean.

The values for the vector $x_1$, the vector $p_1$, the vector $u_1$, and the noise terms $w_1$ and $v_1$ can be determined using a first set of process recipes, a first set of component characteristics, a first set of assumptions, a first set of operational conditions, or a first set of BIST rules, or a combination thereof.

During various embodiments, a first process can be performed on the one or more wafers that are positioned within the processing chamber and the pressure can be reduced in the processing chamber.

In one example, the rate of change for chamber pressure $\dot{P}_c$ can be modeled as a function $f$ of chamber pressure ($P_c$), a process parameter (v) that can be related to a valve and/or pump coupled to the processing chamber, and process parameters $p_1$-$p_n$ that can be process parameters other than chamber pressure $P_c$, (such as gas flows), and the model can be shown as follows:

$$\dot{P}_c = f_1(p_1, p_2, \ldots, p_n, v)$$

A special operational condition exists when the valve is fully closed—in this case, the pressure rise rate becomes independent of the pressure controller. For this condition, the chamber pressure rise rate $\dot{P}_c$ can be:

$$\dot{P}_c = f_1(p_1, p_2, \ldots, p_n, v=0)$$

Given this model, one method for individually estimating MFC flow rates includes using an inverse model:

$$p_i = f_1^{-1}(\dot{P}_c)$$

In addition, the steady-state behavior can be modeled as follows:

$$P_c = g_1(p_1, p_2, \ldots, p_n, v)$$

An inverse model can be used to estimate a parameter given the rest of the parameters, that is:

$$p_i = g_1^{-1}(P_c, v)$$

$$v = g_1^{-1}(p_1, p_2, \ldots, p_n, P_c), \text{ and}$$

$$P_c = g_1(p_1, p_2, \ldots, p_n, v)$$

The valve angle opening can be measured in percent, and the processing chamber pressure can be measured in mTorr. Alternatively, the opening can be expressed as an angular position or an opening size. In addition, a pump may be used to control chamber pressure and it may be characterized using a flow rate or a pressure difference. These models provide multiple estimates of the process parameters for different operational conditions in which the rate of change for chamber pressure can be used to monitor a system. For example, flow rates for process gasses and/or backside gasses may be monitored using these models. In addition, BIST rules can be created for the process gas supply system and/or the backside gas system.

In a second example, the rate of change for chamber temperature $\dot{T}_c$ can be modeled as a function $f$ of a process parameter (h) that can be related to a temperature control element coupled to the processing chamber, and process parameters $p_1$-$p_n$ that can be process parameters other than chamber temperature $T_c$, (such as gas flows, pressures, concentrations, etc), and the model can be shown as follows:

$$\dot{T}_c = f_2(p_1, p_2, \ldots, p_n, h)$$

A special operational condition exists when the heater power is turned off—in this case, the rate of change for the chamber temperature may become independent of the temperature controller. For this condition, the rate of change for the chamber temperature $\dot{T}_c$ can be:

$$\dot{T}_c = f_2(p_1, p_2, \ldots, p_n, h=0)$$

Given this model, one method for individually estimating chamber temperatures includes using an inverse model:

$$p_i = f_2^{-1}(\dot{T}_c)$$

In addition, the steady-state behavior can be modeled as follows:

$$T_c = g_2(p_1, p_2, \ldots, p_n, h)$$

An inverse model can be used to estimate a value for a process parameter given the rest of the process parameters, that is:

$$p_i = g_2^{-1}(T_c, h),$$

$$h = g_2^{-1}(p_1, p_2, \ldots, p_n, T_c), \text{ and}$$

$$T_c g_2(p_1, p_2, \ldots, p_n, h)$$

Thus, these models provide multiple estimates of the process parameters for different operational conditions in which the rate of change for chamber temperature can be used to monitor a system. For example, flow rates for process gasses can be monitored using these models.

In a third example, rate of change for a reactant concentration $\dot{R}$ can be modeled as a function f a process parameter r that is related to a flow control element coupled to the processing chamber, and process parameters $p_1$-$p_n$ that can be process parameters other than reactant concentration (such as gas flows, temperatures, pressures, concentrations, etc.), and the model can be shown as follows:

$$\dot{R} = f_3(p_1, p_2, \ldots, p_n, r)$$

A special operational condition exists when the gas valve is fully closed—in this case, rate of change for a reactant concentration $\dot{R}$ becomes independent of the gas flow controller. For this operational condition, the rate of change for the reactant concentration $\dot{R}$ can be:

$$\dot{R} = f_3(p_1, p_2, \ldots, p_n, r=0)$$

Given this model, one method for individually estimating wafer surface states includes using an inverse model:

$$p_i = f_3^{-1}(\dot{R})$$

In addition, the steady-state behavior can be modeled as follows:

$$R = g_3(p_1, p_2, \ldots, p_n, r)$$

An inverse model can be used to estimate a parameter given the rest of the parameters, that is:

$$p_i = g_3^{-1}(R, r)$$

$$r = g_3^{-1}(p_1, p_2, \ldots, p_n, R), \text{ and}$$

$$R = g_3(p_1, p_2, \ldots, p_n, r)$$

In a fourth example, in a single wafer system where a wafer is positioned on a temperature controlled wafer holder, the rate of change for wafer temperature $\dot{T}_w$ can be modeled as a function f of a process parameter z that is related to a temperature control element coupled to a substrate holder in the processing chamber, and process parameters $p_1$-$p_n$ that can be process parameters other than wafer temperature $\dot{T}_w$, (such as backside gas flows, temperatures, pressures, concentrations, etc.), and the model can be shown as follows:

$$\dot{T}_w = f_4(p_1, p_2, \ldots, p_n, z)$$

A special operational condition exists when the power to a heater in the substrate holder is turned off—in this case, the rate of change for the wafer temperature may become independent of the heater power controller. For this condition, the rate of change for the wafer temperature $\dot{T}_w$ can be:

$$\dot{T}_w = f_4(p_1, p_2, \ldots, p_n, z=0)$$

Given this model, one method for individually estimating wafer temperatures includes using an inverse model:

$$p_i = f^{3-1}(\dot{T}_w)$$

In addition, the steady-state behavior can be modeled as follows:

$$T_w = g_3(p_1, p_2, \ldots, p_n, z)$$

Given this model, one method for individually estimating backside flow rates includes using an inverse model:

$$p_i = f_4^{-1}(\dot{T}_w)$$

In addition, the steady-state behavior can be modeled as follows:

$$T_w = g_4(p_1, p_2, \ldots, p_n, z)$$

An inverse model can be used to estimate a parameter given the rest of the parameters, that is:

$$p_i = g_4^{-1}(T_w, z),$$

$$z = g_4^{-1}(p_1, p_2, \ldots, p_n, T_w), \text{ and}$$

$$T_w = g_4(p_1, p_2, \ldots, p_n, z)$$

Thus, these models provide multiple estimates of the process parameters for different operational conditions in which the rate of change for wafer temperature can be used to monitor a system. For example, flow rates for backside gasses can be monitored using these models. Software can be used to examine the estimated parameters to generate diagnostics based on the operational conditions, and operational limits in the BIST table.

In one case, a first process model can be determined for the first process that relates a first rate of change for at least one parameter of a first set of first process parameters to a second set of first process parameters as and/or after a first parameter in the second set is changed from a first value to a second value, wherein the second set does not include the at least one parameter of the first set. The first process parameters are selected from the vectors $x_1$, $p_1$, and $u_1$ in the process model described above.

In one embodiment, the monitoring process can include measuring a rate of change for at least one parameter of a first set of process parameters as a first parameter in a second set of process parameters is changed from a first value to a second value. The second set of process parameters does not include the at least one parameter of the first set of process parameters. The measured rate of change can be determined by monitoring one or more process parameters in real-time as and/or after the first parameter of the second set is changed from a first value to a second value. For example, the monitoring process may include measuring a rate of change for chamber pressure as and/or after a valve opening is changed from a first position to a second position.

In addition, a first inverse process model can be executed for the first process that relates the first measured rate of change to a value for a second parameter in the second set of first process parameters to obtain a predicted value for the second parameter. For example, an inverse model may relate the second parameter, such as a gas flow rate, to the measured rate of change for chamber pressure. Alternatively, other rates of change and other process parameters may be used.

The predicted value for the process parameter can be compared to an expected value for the process parameter. The dynamic estimation error can be calculated using the difference between the predicted value for the process parameter and the expected value for the process parameter. The expected value may be a dynamically changing value, a measured value, a stored value, a historical value, a calculated value, and/or a recipe setpoint. For example, the predicted value may be a predicted gas flow rate and the expected value may be an expected gas flow rate.

In one embodiment, a first dynamic estimation error for the first process can be calculated using a difference between the predicted value for the second parameter in the second set of first process parameters and an expected value for the second parameter, and the expected value for the second parameter can be determined using a process recipe, an operational condition, or a BIST rule for the first process. For example, a dynamic estimation error may be calculated using the difference between a predicted gas flow rate and an expected gas flow rate. Alternatively, the dynamic estimation error may be calculated using a difference between a predicted value, a measured value, a calculated value, and/or a historical value for a process parameter.

In some processing systems, a pressure control system can be coupled to the processing chamber, and the pressure control system can include a gate valve and the chamber pressure change rate can be dependent on the gate valve opening. For example, a process model may relate a rate of change for chamber pressure to the second set of process parameters that does not include chamber pressure as and/or after a valve opening is changed from a first position to a second position.

Alternatively, the pressure control system can include a pump and the chamber pressure change rate may be dependent on a pump speed and/or pumping volume. For example, a process model may relate a rate of change for chamber pressure to the second set of process parameters that does not include chamber pressure as and/or after a pump speed and/or pumping volume is changed from a first value to a second value. In other cases, pump and valve parameters may be combined.

In some processing systems, a temperature control system can be coupled to the processing chamber, and the temperature control system can include a heater and the chamber temperature change rate can be dependent on the heater power. For example, a process model may relate a rate of change for chamber temperature to the second set of process parameters that does not include chamber temperature as and/or after a heater power is changed from a first power level to a second power level. In addition, an inverse model may relate a reaction rate to the measured rate of change for chamber temperature, and a dynamic estimation error may be calculated using the difference between the predicted value for a reaction rate and the expected value for the reaction rate.

In some processing systems, a temperature control system can be coupled to a wafer holder in a processing chamber, and the temperature control system can include a wafer heater in the wafer holder and the wafer temperature change rate can be dependent on the heater power provided to the wafer heater. For example, a process model may relate a rate of change for wafer temperature to the second set of process parameters that does not include wafer temperature as and/or after the wafer heater power is changed from a first power level to a second power level. In addition, an inverse model may relate a flow rate for a backside gas to the measured rate of change for wafer temperature, and a dynamic estimation error may be calculated using the difference between the predicted value for a flow rate for a backside gas and the expected value for flow rate for a backside gas.

Referring again to FIG. 11, in 1125, a query can be performed in which the dynamic estimation error is compared to an operational limit established for the process. In one embodiment, the first dynamic estimation error for the first process can be compared to an operational limit established for the first process; the first process (wafer processing) can continue when the first dynamic estimation error is within the operational limit; and the first process can be examined when the first dynamic estimation error is not within the operational limit. In addition, the operational limit is established by a threshold determined for one or more BIST rules in a BIST table for the first process. Alternatively, the operational limit may be established by a threshold determined for one or more rules in an operational conditions table for the first process or by a process recipe table.

Procedure 1100 can branch to 1150 and continue when the dynamic estimation error is within the operational limit established for the process. The difference between the dynamic estimation error for the process and the operational limit established for the process can be monitored to predict potential problems. For example, process drift may be identified, degrading components may be identified, and/or cleaning times may be identified. Procedure 1100 can branch to 1130, and procedure can continue when the dynamic estimation error is not within the operational limit established for the process. BIST rules, process results data, and operational conditions data can be stored in the BIST table before, during, and/or after the process is performed.

In 1130, a query can be performed in which the dynamic estimation error is compared to a warning limit established for one or more BIST rules in the BIST table for the process. Alternatively, the warning limit may be established by a threshold determined for one or more rules in an operational conditions table for the first process or by a process recipe table.

Procedure 1100 can branch to 1150 and continue when the dynamic estimation error is within the warning limit established for the process. The difference between the dynamic estimation error for the process and the warning limit can be monitored to predict potential problems. For example, process drift may be identified, degrading/failing components may be identified, and/or cleaning times may be identified. Procedure 1100 can branch to 1135, and can continue when the dynamic estimation error is not within the warning limit established for the process. A warning message can be sent when dynamic estimation error is within and/or approaching the warning limit. Alternatively, a process may be paused or stopped when a warning message is sent and operator intervention may be required. A fault message can be sent when dynamic estimation error is not within and/or approaching the warning limit.

In 1135, a query can be performed to determine if the monitoring procedure requires modification. The query can be performed to determine if a new process model, a new BIST rule, a new process recipe, or a maintenance procedure, or a combination thereof, is required when the dynamic estimation error is not within the warning limit established for the process. During a monitoring procedure, a controller can be used to determine if the process being performed is a new process or is associated with a new BIST rule. Procedure 1100 can branch to 1140 when the monitoring procedure requires modification, and procedure 1100 can branch to 1150 when a modification is not required.

In 1140, the monitoring procedure can be modified. During modification, a new process model for the process can be determined when a new process model is required, and the new process model relates a new first rate of change for at least one new parameter of a new first set of process parameters to a new second set of process parameters as and/or after a new first parameter in the new second set is changed from a new first value to a new second value. The new second set does not include the at least one new parameter of the new first set, and the wafer processing can continue using the new process model.

In addition, a new BIST rule can be created for the process when a new BIST rule is required, the new BIST rule having new operational and warning limits, new tolerance values, and new messages and being based on at least one pre-existing BIST rule created for the process. The new BIST rule with the new operational limit and the new tolerance values can be entered into a BIST table, and wafer processing can continue.

Furthermore, a new process recipe can be established for the process when a new process recipe is required, and the new process recipe can have new process parameters and a new BIST rule associated therewith. The new process parameters can have values within and/or outside of normal production limits. During normal production processing, the new process parameters can have values within the normal production limits. During non-production processing, the new process parameters can have values outside the normal production limits. The new BIST rule and new process recipe can be entered into a BIST table when the new BIST rule is not in the BIST table, and wafer processing can continue using the new process recipe.

The monitoring procedure can be paused or stopped when the procedure cannot be modified, that is when a new BIST rule cannot be created, or a new process recipe cannot be established, or a maintenance procedure is required. Procedure 1100 can branch to 1145 when a maintenance procedure is required.

In one embodiment, when the dynamic estimation error is not within the warning limit, the real-time dynamic model, the predicted parameter value, the measured rate of change, and/or the dynamic estimation error can be examined, and a new BIST rule or process recipe with new values based on the current and/or pre-existing values can be established. In addition, the new BIST rule and or process recipe with new operational and warning limits and new tolerance values can be stored, and procedure 1100 can continue.

Alternatively, the monitoring software may need data from another controller (host) and/or input from a user to determine when to create a new BIST rule. In addition, the rate of change for a process parameter and/or a process drift value for the process can be monitored, and one or more BIST rules can be created and/or used when a process parameter and/or a process drift value for the process approaches an operational and/or warning limit. For example, special BIST rules may be established to monitor process drift, and these special BIST rules may be used to determine when a cleaning and/or maintenance procedure should be performed.

In 1145, a maintenance procedure can be performed. On or more BIST rules can be used to determine the type of maintenance that is required. When a maintenance procedure is completed, procedure 1100 can branch to 1165. In addition, BIST rules may be used during the maintenance procedure.

In 1150, a query can be performed to determine when an additional process is required. When another process is required, procedure 1100 can branch to 1115, and when another process is not required, procedure 1100 can branch to 1155. When the process is performed multiple times and/or multiple processes are performed, one or more different models can be executed and one or more different BIST rules, process recipes, operational conditions, and/or sets of process parameters can be used.

In 1155, a query can be performed to determine when a different process is required. When a different process is required, procedure 1100 can branch to 1160, and when a different process is not required, procedure 1100 can branch to 1165.

In 1160, one or more different processes can be performed and monitoring procedures as described herein may be used. When a different process is required, one or more wafers can be transferred to another processing system, or one or more of the wafers can be transferred to a measurement system.

In 1165, procedure 1100 can end. When procedure 1100 ends, one or more wafers can be removed from the processing chamber, transferred to a storage location, and/or transferred to a measurement tool.

When a monitoring procedure, such as procedure 1100, is performed, the first parameter in the second set of first process parameters can be changed using a series of steps; the process model can be determined using the series of steps; the measured rate of change can be determined using the series of steps; the inverse process model can be executed using the series of steps; and the dynamic estimation error can be calculated using the series of steps.

In other embodiments, when a monitoring procedure, such as procedure 1100, is performed, a wafer can be divided into a plurality of measurement zones; the process model can be determined using the plurality of measurement zones; the measured rate of change can be determined using the plurality of measurement zones; the inverse process model can be executed using the plurality of measurement zones; and the dynamic estimation error can be calculated using the plurality of measurement zones.

In other embodiments, when a monitoring procedure, such as procedure 1100, is performed, the processing chamber can be divided into a plurality of measurement zones; the process model can be determined using the plurality of measurement zones; the measured rate of change can be determined using the plurality of measurement zones; the inverse process model can be executed using the plurality of measurement zones; and the dynamic estimation error can be calculated using the plurality of measurement zones.

In additional embodiments, when a monitoring procedure, such as procedure 1100, is performed, a plurality of temperature control zones can be established in the processing chamber; the thermal interaction between the temperature control zones can be modeled; and the thermal interaction model can be used to determine the process model and/or the inverse process model. In addition, a plurality of gas flow control zones can be established in the processing chamber; the flow interaction between the gas flow control zones can be modeled; and the flow interaction model can be used to determine the process model and/or the inverse process model.

In other additional embodiments, when a monitoring procedure, such as procedure 1100, is performed, the thermal interaction between the one or more wafers and a processing space within the processing chamber can be modeled; and this thermal interaction model can be used to determine the process model and/or the inverse process model.

Furthermore, a wafer curvature model may be created when one or more curved wafers are being processed; and the wafer curvature model may be incorporated into the process model and/or the inverse process model.

Before, during, and/or after a monitoring procedure is performed, historical data can be obtained, and the historical data can be used to determine the process to perform, the process recipe to use, the BIST tables to use, and/or the process models to use. In addition, wafer state data can be obtained, and the wafer state can be used to determine the process to perform, the process recipe to use, the BIST tables to use, and/or the process models to use.

A procedure, such as illustrated in FIG. 11, can be used with a thermal processing system, a MLD system, an etching system, a deposition system, a plating system, a polishing system, an implant system, a developing system, or a transfer system, or a combination of two or more thereof. In addition, the processes performed can include a MLD process, a thermal process, an etching process, a deposition process, a plating process, a polishing process, an implant process, a developing process, or a transfer process, or a combination of two or more thereof.

In one embodiment, a procedure, such as illustrated in FIG. 11, can be used with a deposition procedure that includes using a first precursor process, a first purging process, a second precursor process, and a second purging process. When creating process models for processing systems operating at low pressures and using process recipes that include injecting a process gas, such as a precursor-containing gas or a purging gas, into the processing chamber, one or more models can be created that relate a gas flow rate (GFR) for a process gas to a rate of change for pressure (RCP) within the processing chamber and/or within one or more control zones in the processing chamber. For example, a rate of change can be expressed as a positive or negative number. Alternatively, a pressure rise rate (PRR) may be used.

For example, a simplified model of a processing chamber can be created that relates a first process parameter, such as Gas Flow Rate (GFR), to the rate of change of a second process parameter, such as a Rate of Change of Pressure (RCP). Then, for any given process recipe step while and/or after a gate valve position is changed and a process gas flow is introduced, a Measured Rate of Change of Pressure (MRCP) can be obtained by monitoring the real-time process parameters. Next, using the MRCP and one or more process models, a Predicted Gas Flow Rate (PGFR) can be calculated. Then, the PGFR can be compared to the Expected Gas Flow Rate (EGFR)—an expected gas flow rate for a process gas can be a setpoint in the recipe. A dynamic estimation error can be calculated using the difference between the predicted value PGFR and expected value EGFR. The dynamic estimation error can be compared to a limit established for the current operating condition. A process can continue when the dynamic estimation error is within the operational limit, and the operational limit can be established by a BIST rule.

In addition, when the dynamic estimation error is not within the operational limit, the dynamic estimation error can be compared to a warning limit for the process established by one or more BIST rules in the BIST table for the process, and a warning message can be sent identifying a potential problem with the process and/or the MLD system and the process continued when the first dynamic estimation error is within the warning limit, or a fault message can be sent identifying a known problem with the process and/or the MFC system and the process stopped when the dynamic estimation error is not within the warning limit. The process and/or processing system can be examined further when the dynamic estimation error is not within the operational limit established for the process. Alternatively, a dynamic estimation error may be determined using a calculated value, a measured value, a historical value, and/or an expected value.

For example, another simplified model of a process may be created that relates a first process parameter, such as Wafer Temperature (WT), to the rate of change of a second process parameter, such as a Chamber Temperature Rate of Change (CTRC). Then, for any given process recipe step while and/or after a power level is changed, a Measured Chamber Temperature Rate of Change (MCTRC) can be obtained by monitoring the real-time process parameters. Next, using the MCTRC and one or more process models, a Predicted Wafer Temperature (PWT) can be calculated. Then, the PWT can be compared to the Expected Wafer Temperature (EWT)—this expected wafer temperature can be the setpoint in the recipe. A dynamic estimation error can be calculated using the difference between the predicted value PWT and expected value EWT. The dynamic estimation error can be compared to a limit established for the current operating condition. Alternatively, a dynamic estimation error may be determined using a calculated value, a measured value, a historical value, and/or an expected value.

In addition, another simplified model of a process can be created that relates a first process parameter, such as Backside Gas Flow Rate (BGFR), to the rate of change of a second process parameter, such as a Wafer Temperature Rate of Change (WTRC). Then, for any given process recipe step while and/or after wafer heater power is changed and a backside gas is introduced, a Measured Wafer Temperature Rate of Change (MWTRC) can be obtained by monitoring the real-time process parameters. Next, using the MWTRC and one or more process models, a Predicted Backside Gas Flow Rate (PBGFR) can be calculated. Then, the PBGFR can be compared to the Expected Backside Gas Flow Rate (EBGFR)—this expected backside gas flow rate can be the setpoint in the recipe. A dynamic estimation error can be calculated using the difference between the predicted value PBGFR and expected value EBGFR. The dynamic estimation error can be compared to a limit established for the current operating condition. Alternatively, a dynamic estimation error may be determined using a calculated value, a measured value, a historical value, and/or an expected value.

For example, another simplified model of a process may be created that relates a first process parameter, such as reactant concentration (RC), to the rate of change of a second process parameter, such as a rate of change for the gas flow rate (RCGFR). Then, for any given process recipe step while and/or after an MFC is changed and a reactant gas flow is introduced, a Measured Rate of Change for a Gas Flow Rate (MRCGFR) can be obtained by monitoring the real-time process parameters. Next, using the MRCGFR and one or more models, a Predicted Reactant Concentration (PRC) can be calculated. Then, the PRC can be compared to the Expected Reactant Concentration (ERC)—this expected reactant concentration can be a setpoint in the recipe. A dynamic estimation error can be calculated using the difference between the predicted value PRC and expected value ERC. The dynamic estimation error can be compared to a limit established for the current operating condition. Alternatively, a dynamic estimation error may be determined using a calculated value, a measured value, a historical value, and/or an expected value.

In addition, another simplified model of a process can be created that relates a first process parameter, such as Backside Gas Flow Rate (BGFR), to the rate of change of a second process parameter, such as a Wafer Temperature Rate of Change (WTRC). Then, for any given process recipe step while and/or after a "backside" MFC is changed and a backside gas is introduced, a Measured Wafer Temperature Rate of Change (MWTRC) can be obtained by monitoring the real-time process parameters. Next, using the MWTRC and the model described above, a Predicted Backside Gas Flow Rate (PBGFR) can be calculated. Then, the PBGFR can be compared to the Expected Backside Gas Flow Rate (EBGFR)—this expected backside gas flow rate can be the setpoint in the recipe. A dynamic estimation error can be calculated using the difference between the predicted value PBGFR and expected value EBGFR. The dynamic estimation error can be compared to a limit established for the current operating condition. Alternatively, a dynamic estimation error may be determined using a calculated value, a measured value, a historical value, and/or an expected value.

Alternatively, one or more models may be created that can relate a rate of change for at least one parameter of a first set of process parameters to a process parameter value for an "un-measurable" process parameter that is not included in the first set of process parameters. For example, the monitoring process may include determining a measured pressure rise rate (MPRR) by monitoring one or more process parameters as the process gas is flowed into the processing chamber, calculating a predicted value for an "un-measurable" process parameter (PUPP) using the process model, and comparing the predicted/calculated (PUPP) to an expected value for the "un-measurable" process parameter (EUPP), where the (EUPP) has been established by the process recipe value.

In addition, one or more models may be created that relate a gas flow rate (GFR) for a process gas to a rise rate value for an "un-measurable" process parameter (MURR) that may be estimated using virtual sensors configured within the processing chamber and/or within one or more control zones in the processing chamber. The monitoring process can include determining a rise rate value for an "un-measurable" (MURR) by using one or more virtual sensors to estimate one or more "un-measurable" process parameters as the process gas is flowed into the processing chamber, calculating a predicted gas flow rate (PGFR) using a process model, and comparing the predicted/calculated (PGFR) to an expected gas flow rate (EGFR), where the EGFR has been established by a fixed and/or intelligent set point in the process recipe. Techniques for establishing virtual sensors and intelligent set points are taught in co-pending U.S. patent application Ser. No. 11/043,199 and Ser. No. 11/043,459 each entitled "METHOD AND APPARATUS FOR MONOLAYER DEPOSITION" and each filed on Jan. 26, 2005, both of which are incorporated herein by reference in their entirety.

The simplified models are shown herein for the illustrative purposes and are not intended to limit the scope of the invention. For example, the variables can be replaced with vectors, multivariable functions, and multivariable equations.

Figure 12:
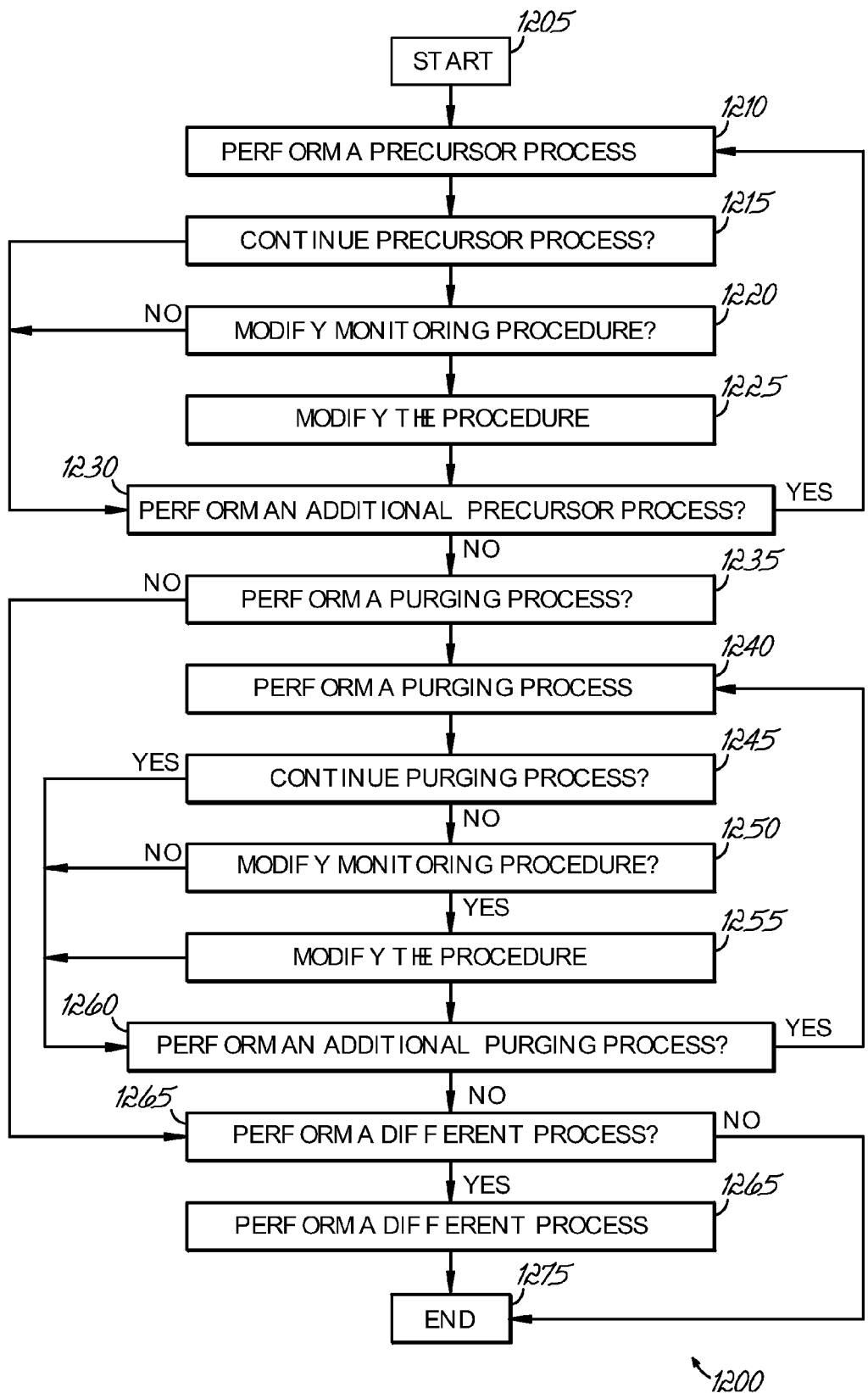
FIG. 12 illustrates a simplified flow diagram of a method of monitoring a monolayer deposition (MLD) system in real-time using one or more process models in accordance with embodiments of the invention.

FIG. 12 illustrates a simplified flow diagram of a method of monitoring a monolayer deposition (MLD) system in real-time using one or more process models in accordance with embodiments of the invention. Monolayer deposition techniques are also taught in U.S. patent application Ser. No. 11/043,199 and Ser. No. 11/043,459, referred to above.

A number of process models and operating conditions can be created for a processing system that can include temperature control components, the pressure control components, gas supply components, mechanical components, computing components, or software components, or combinations thereof.

The MLD procedure 1200 can start in 1205 in which pre-processing conditions can be established. For example, the processing chamber can be sealed, and the chamber pressure, chamber temperature, wafer temperature, and/or process gas conditions can be changed to operational or pre-operational values before a process is performed.

A processing system can obtain data and use the data to establish one or more recipes to use before, during, and/or after a process is performed. In addition, the data can include dynamic and/or static modeling information for predicting the performance of the processing system before, during, and/or after the process is performed. Furthermore, the data can include measured and/or predicted data from previous MLD processes.

In addition, the data can include recipe data, historical data, wafer data, such as critical dimension (CD) data, profile data, thickness data, uniformity data, and optical data, such as refractive index (n) data and extinction coefficient (k) data. Wafer data can also include the number of layers, layer position, layer composition, layer uniformity, layer density, and layer thickness. Layers can include semiconductor material, resist material, dielectric material, and/or metallic material. In addition, data can comprise correction data, error data, measurement data, or historical data, or a combination of two or more thereof.

In task 1210, a precursor process can be performed on a plurality of wafers positioned in the processing chamber in a processing system. In one embodiment, the wafers can be positioned at different heights in a "batch-type" processing chamber. For example, a vertical boat can be used to position the wafers in a batch-processing chamber. In various embodiments, the wafers can include production wafers, instrumented wafers, test wafers, or dummy wafers, or combinations thereof. In addition, the thermal processing chamber can include a plurality of control zones and the precursor processing models, the operating conditions, and/or precursor process recipes can be different in one or more of the plurality of control zones.

When a first precursor process is performed, a first precursor-containing gas can be flowed into the thermal processing chamber. The first precursor-containing gas can include a first precursor, a first carrier gas, and/or an inert gas. When a second precursor process is performed, a second precursor-containing gas can be flowed into the thermal processing chamber. The second precursor-containing gas can include a second precursor, a second carrier gas, and/or an inert gas.

When a first precursor process is being performed, one or more of the process parameters can be changed from a first value to a second value, and one or more real-time dynamic process models can be created that can be used to predict the system's response.

When a precursor process is performed, a precursor process (first and/or second) can be monitored using a first set of nonlinear differential equations $\dot{x}_1$ and a first output equation $y_1$, wherein $$\dot{x}_1 = f(x_1, p_1, u_1)$$

$$y_1 = g(x_1, p_1, u_1)$$

and $x_1$, $p_1$, and $u_1$ are precursor process parameters in which the first vector $x_1$ comprises a first state vector for the precursor process, the first vector $p_1$ comprises one or more modeling parameters for the precursor process, and the vector $u_1$ comprises one or more inputs applied to the precursor process.

A dynamic estimation error for a precursor process (first and/or second), and the dynamic estimation error can be compared to an operational limit established by one or more BIST rules in the BIST table for the precursor process. The precursor process can continue when the dynamic estimation error is within the operational limit; and the dynamic estimation error can be compared to a warning limit established for the precursor process when the dynamic estimation error is not within the operational limit.

When the dynamic estimation error is within the warning limit, a warning message can be sent that identifies a potential problem with the precursor process and/or the MLD system, and the precursor process can continue. The BIST rule that is presently being used in the calculation process can be used to identify the potential problem with the precursor process and/or the MLD system.

When the dynamic estimation error is not within the warning limit, a fault message can be sent that identifies a known problem with the precursor process and/or the MLD system and the precursor process can be stopped. The BIST rule that is presently being used in the calculation process can be used to identify the known problem with the precursor process and/or the MLD system.

When the dynamic estimation error is being calculated, a precursor process model can be determined for the precursor process that relates a first rate of change for at least one parameter of a first set of precursor process parameters to a second set of the precursor process parameters as and/or after a first parameter in the second set is changed from a first value to a second value, and the second set does not include the at least one parameter of the first set.

In a first example, a precursor process model may relate a rate of change for chamber pressure to the second set of precursor process parameters that does not include chamber pressure as and/or after a pressure control parameter (gate valve parameter and/or pump parameter) is changed from a first value to a second value.

In second example, a precursor process model may relate a chamber chemistry state (a reactant concentration for precursor molecules) in the thermal processing chamber to a rate of change for chamber pressure in the thermal processing chamber as and/or after a pressure control parameter (gate valve parameter and/or pump parameter) is changed from a first value to a second value.

In a third example, a precursor process model may relate a chamber chemistry state (a reactant concentration for the first precursor molecules) in the thermal processing chamber to a rate of change for the flow rate for a process gas, such as a precursor-containing gas, into the thermal processing chamber as and/or after a gas system flow control parameter (mass flow control valve position) is changed from a first value to a second value.

In a fourth example, a precursor process model may relate a substrate temperature for a substrate in the thermal processing chamber to a rate of change for the temperature in the thermal processing chamber as and/or after a temperature control system parameter (a heater power) is changed from a first power level to a second power level.

Alternatively, other rates of change and other process parameters may be used when developing the models and BIST rules.

Next, a first measured rate of change for the at least one parameter of the first set of the precursor process parameters can be determined in real time as and/or after the first parameter in the second set of first precursor process parameters is changed from the first value to the second value. The measured rate of change can be determined by monitoring one or more precursor process parameters in real-time as and/or after the first parameter in the second set is changed from a first value to a second value.

In one example, a measured rate of change for chamber pressure can be determined, and the measured rate of change for chamber pressure determined as and/or after the pressure control parameter (gate valve parameter and/or pump parameter) is changed from the first value to the second value.

In a second example, a measured rate of change for the flow rate for a process gas, such as a precursor-containing gas, into the thermal processing chamber, and the measured rate of change for the flow rate for the process gas is determined as and/or after a gas system flow control parameter (mass flow control valve position) is changed from a first value to a second value.

In a third example, a measured rate of change for the chamber temperature can be determined, and the measured rate of change for the chamber temperature is determined as and/or after a temperature control system parameter (heater power) is changed from a first power level to a second power level.

In a fourth example, a measured rate of change for the chamber chemistry can be determined, and the measured rate of change for the chamber chemistry is determined as and/or after a system parameter is changed from a first value to a second value.

In other examples, a measured rate of change for a deposited layer, an etched layer, a saturation state, or a contamination state can be determined.

Then, an inverse precursor process model for the precursor process can be executed that relates the first measured rate of change to a value for a second parameter in the second set of the precursor process parameters to obtain a predicted value for the second parameter.

In one example, an inverse model may relate a process gas flow rate, to a measured rate of change for chamber pressure. In a second example, an inverse model may relate a chamber chemistry state (a reactant concentration for the precursor molecules) in the thermal processing chamber to a measured rate of change for chamber pressure. In a third example, an inverse model may relate a chamber chemistry state (a reactant concentration for the precursor molecules) in the thermal processing chamber to a measured rate of change for a flow rate for a process gas. In a fourth example, an inverse model may relate a wafer/substrate temperature to a measured rate of change for chamber temperature and/or substrate holder temperature. In other examples, an inverse model may relate a process and/or system parameter to a measured rate of change for a deposited layer, an etched layer, a saturation state, or a contamination state. Alternatively, other rates of change and other process parameters may be used.

Finally, the dynamic estimation error for the precursor process can be calculated using a difference between the predicted value for the second parameter in the second set of the precursor process parameters and an expected value for the second parameter, and the expected value for the second parameter can be determined using a BIST rule for the precursor process. The expected value may be a dynamically changing value, a measured value, a stored value, a calculated value, and/or a recipe setpoint. Alternatively, the dynamic estimation error may be calculated using a difference between a predicted value, a measured value, a calculated value, and/or historical value for one or more process parameters.

In one example, the predicted value may be a predicted process gas flow rate and the expected value may be an expected process gas flow rate, and the process gas may include a precursor. In a second example, the predicted value may be a predicted chamber chemistry state and the expected value may be an expected chamber chemistry state. In other examples, the predicted and expected values may be deposition thicknesses, etching dimensions, saturation state values, or contamination state values.

When creating process models for an MLD procedure being performed at low pressures and using process recipes that include injecting a precursor-containing gas into a thermal processing chamber that can include a plurality of injection/control zones, one or more models can be created that relate a gas flow rate (GFR) for a process gas, such as a precursor-containing gas, to a rate of change for pressure (RCP) within the processing chamber and/or within one or more injection/control zones in the processing chamber. For example, a rate of change can be expressed as a positive or negative number. Alternatively, a pressure rise rate (PRR) may be used.

For example, a simplified model of a precursor process can be created that relates a first process parameter, such as Precursor-Containing Gas Flow Rate (PCGFR), to the rate of change of a second process parameter, such as a Rate of Change of Pressure (RCP). Then, for any given process recipe step while and/or after a valve position is changed and a process gas is introduced, a Measured Rate of Change of Pressure (MRCP) can be obtained by monitoring the realtime process parameters during the precursor process. Next, using the MRCP and one or more models, a Predicted Precursor-Containing Gas Flow Rate (PPCGFR) can be calculated. Then, the PPCGFR can be compared to an Expected Precursor-containing Gas Flow Rate (EPCGFR)— the expected gas flow rate can be associated with the precursor-containing gas and can be established by a setpoint in the precursor process recipe. A precursor process dynamic estimation error can be calculated using the difference between the predicted value PPCGFR and expected value EPCGFR. The precursor process dynamic estimation error can be compared to limits established for the current operating condition. Alternatively, other process parameters and other rates of change may be used.

Referring again to FIG. 12, in 1215, a query can be performed to determine whether to continue the precursor process. When the precursor process is operating within limits established for the precursor process, procedure 1200 can branch to 1230. When the precursor process is not operating within limits established for the precursor process, procedure 1200 can branch to 1220.

In one embodiment, the precursor process dynamic estimation error is compared to an operational limit established for one or more BIST rules in the BIST table for the precursor process. The precursor process can continue when the precursor process dynamic estimation error is within the operational limit. When creating and or verifying BIST rules, a precursor process may be continued, paused, or stopped when the precursor process dynamic estimation error is not within the operational limit. For example, operator and/or host intervention may be required.

In addition, the precursor process dynamic estimation error can also be compared to a warning limit established for one or more BIST rules in the BIST table for the precursor process. The precursor process can be continued when the precursor process dynamic estimation error is within the warning limit. The precursor process can be paused and/or stopped when the precursor process dynamic estimation error is not within the warning limit.

When the precursor process dynamic estimation error is not with the operational limit, the precursor process dynamic estimation error can then be compared to the warning limit for the precursor process; a warning message identifying a potential problem with the precursor process and/or the MLD system can be sent and the precursor process can be continued when the precursor process dynamic estimation error is within the warning limit.

When the precursor process dynamic estimation error is not with the warning limit, a fault message identifying a known problem with the precursor process and/or the MLD system can be sent and the precursor process can be stopped.

In various embodiments, warning messages can be sent that identify potential problems with the precursor process, the thermal processing chamber, the pressure control system coupled to the thermal processing chamber, the gas supply system coupled to the thermal processing chamber, the temperature control system coupled to the thermal processing chamber, the control system coupled to the thermal processing chamber, or a combination thereof.

In addition, fault messages can be sent that identify known problems with the precursor process, the thermal processing chamber, the pressure control system coupled to the thermal processing chamber, the gas supply system coupled to the thermal processing chamber, the temperature control system coupled to the thermal processing chamber, the control system coupled to the thermal processing chamber, or a combination thereof.

For example, BIST rules may be used for chamber components, temperature control elements, pressure control components, gas system components, and/or controller components.

In addition, the rate of change for a precursor process parameter and/or the process drift value for the precursor process can be monitored, and one or more notification messages can be sent when a precursor process parameter and/or the process drift value for the precursor process are approaching an operational and/or warning limit.

Referring again to FIG. 12, in 1220, a query can be performed to determine when to modify the monitoring process for the precursor process. When the precursor process dynamic estimation error is not within the warning limit established for the precursor process, the controller can determine if a new precursor process model, a new BIST rule, or a new precursor process recipe, or a maintenance procedure, or a combination thereof is required. During a monitoring procedure, a controller can be used to determine if the precursor process currently being performed is a new process or should be associated with a new BIST rule. Procedure 1200 can branch to 1225, when a procedure modification can be made. Procedure 1200 can branch to 1230, when a procedure modification cannot be made.

In 1225, the monitoring procedure can be modified. For example, a new BIST rule can be created for the precursor process when a new BIST rule is required, the new BIST rule having new operational and warning limits, new tolerance values, and new messages and being based on at least one pre-existing BIST rule created for the process. The new BIST rule with the new operational and warning limits and the new tolerance values can be entered into a BIST table, and wafer processing can continue. A new process recipe can be established for the precursor process when a new process recipe is required, the new process recipe can have new precursor process parameters and a new BIST rule associated therewith. The new precursor process parameters can have values within and/or outside of normal production limits. During normal production processing, the new precursor process parameters can have values within the normal production limits. During non-production processing, the new precursor process parameters can have values outside the normal production limits. The new BIST rule and new process recipe can be entered into a BIST table when the new BIST rule is not in the BIST table, and wafer processing can continue using the new process recipe. In addition, a new precursor process model can be established.

The precursor process can be paused or stopped when the monitoring procedure cannot be modified or a maintenance procedure is required.

Alternatively, the controller (monitoring software) may need data from another controller (host) and/or input from a user to determine when to modify the monitoring procedure for a precursor process. In addition, the rate of change for a process parameter and/or a process drift value for the precursor process can be monitored, and one or more notification messages can be sent when a process parameter and/or the process drift value for the precursor process approach an operational and/or warning limit.

In 1230, a query can be performed to determine when another precursor process is required. When another precursor process is required, procedure 1200 can branch to 1210, and when another precursor process is not required, procedure 1200 can branch to 1235. When the precursor process is performed multiple times and/or multiple precursor processes are performed, one or more different precursor process models can be executed and one or more different precursor process recipes may be used.

During a precursor process, one or more reactants can be used and reactant/precursor molecules ($R_A$ and $R_B$), can react with the surface until the surface is saturated. For example, precursor process conditions can be chosen to stop a process step when the surface is completely saturated. Monolayer deposition processes sometimes use the self-limiting surface saturation aspect to control the film characteristics. Alternatively, precursor processes may be made longer in order to ensure that the surface is saturated to slightly over-saturated with precursor molecules. In some cases, the process results can be relatively independent of slight variations in the amount of precursor supplied to the surface.

In one embodiment, during a MLD procedure, a first precursor process can be performed that is followed by a first purging process, then a second precursor process can be performed that is followed by a second purging process. When a first precursor process is performed, a first precursor-containing gas can be introduced into the processing chamber, and the plurality of wafers can be exposed to a first reactant species contained in the first precursor-containing gas. During the first precursor process, a uniform film of $R_A$ molecules can be deposited onto the surfaces of the plurality of wafers. For example, surface saturation states can be monitored, and a physical and/or virtual sensor can be used to determine when the surface saturation state (reactant/precursor concentration) has reached a desired value. During the second precursor process, a uniform film of $R_B$ molecules can be deposited onto the layer of $R_A$ molecules on the surfaces of the plurality of wafers. For example, surface reaction states can be monitored, and a physical and/or virtual sensor can be used to determine when the reactant state (reacted molecule concentration) has reached a desired value.

The operational conditions for a precursor process can include: limits for the flow rate for the precursor-containing gas; concentration values for one or more first reactant ($R_A$)species (precursor molecules); limits and models for the flow between the wafers; limits for a residence time for the first reactant species (precursor molecules); models and limits for determining a reactant species (precursor molecules) concentration for one or more surface saturation zones; and models and limits for determining a chemisorption rate for one or more surface saturation zones. For example, a self-limiting reaction, such as a chemisorption reaction may be determined by a saturation time and may be independent of the reactant exposure time after saturation.

In alternate embodiments, the BIST rules may include intelligent (time-varying) set points and/or virtual sensors.

In 1235, a query can be performed to determine whether a purging process is required. When a purging process is required, procedure 1200 can branch to 1240, and when a purging process is not required, procedure 1200 can branch to 1265.

In 1240, a purging process can be performed on the wafer(s) positioned in the processing chamber in a processing system. In one embodiment, a number of wafers can be positioned at different heights in the processing chamber. In addition, the thermal processing chamber can include a plurality of control zones and the purging processing models, the operating conditions, and/or purging process recipes can be different in one or more of the plurality of control zones. The purging process can be monitored using a purging process model. Alternatively, the purging process does not require monitoring.

When monitoring is required, a purging process model can be created using a second set of nonlinear differential equations $\dot{x}_2$ and a second output equation $y_2$, where $$\dot{x}_2 = f(x_2, p_2, u_2)$$

$$y_2 = g(x_2, p_2, u_2)$$

and the vector $x_2$ comprises a state vector for the purging process, the vector $p_2$ comprises one or more modeling parameters for the purging process, the vector $u_2$ comprises one or more inputs applied to the purging process. Alternatively, one or more additive white noise terms having a zero mean may be incorporated into one or more of the equations.

A dynamic estimation error for a purging process (first and/or second), and the dynamic estimation error can be compared to an operational limit established by one or more BIST rules in the BIST table for the purging process. The purging process can continue when the dynamic estimation error is within the operational limit; and the dynamic estimation error can be compared to a warning limit established for the purging process when the dynamic estimation error is not within the operational limit.

When the dynamic estimation error is within the warning limit, a warning message can be sent that identifies a potential problem with the purging process and/or the MLD system, and the purging process can continue. The BIST rule that is presently being used in the calculation process can be used to identify the potential problem with the purging process and/or the MLD system.

When the dynamic estimation error is not within the warning limit, a fault message can be sent that identifies a known problem with the purging process and/or the MLD system and the purging process can be stopped, The BIST rule that is presently being used in the calculation process can be used to identify the known problem with the purging process and/or the MLD system.

When the dynamic estimation error is being calculated, a purging process model can be determined for the purging process that relates a first rate of change for at least one parameter of a first set of purging process parameters to a second set of the purging process parameters as and/or after a first parameter in the second set is changed from a first value to a second value, and the second set does not include the at least one parameter of the first set.

In a first example, a purging process model may relate a rate of change for chamber pressure to the second set of purging process parameters that does not include chamber pressure as and/or after a pressure control parameter (gate valve parameter and/or pump parameter) is changed from a first value to a second value.

In second example, a purging process model may relate a chamber chemistry state (a reactant concentration for precursor molecules) in the thermal processing chamber to a rate of change for chamber pressure in the thermal processing chamber as and/or after a pressure control parameter (gate valve parameter and/or pump parameter) is changed from a first value to a second value.

In a third example, a purging process model may relate a chamber chemistry state (a reactant concentration for the first precursor molecules) in the thermal processing chamber to a rate of change for the flow rate for a process gas, such as a precursor-containing gas, into the thermal processing chamber as and/or after a gas system flow control parameter (mass flow control valve position) is changed from a first value to a second value.

In a fourth example, a purging process model may relate a substrate temperature for a substrate in the thermal processing chamber to a rate of change for the temperature in the thermal processing chamber as and/or after a temperature control system parameter (a heater power) is changed from a first power level to a second power level.

Alternatively, other rates of change and other process parameters may be used when developing the models and BIST rules.

Next, a first measured rate of change for the at least one parameter of the first set of the purging process parameters can be determined in real time as and/or after the first parameter in the second set of first purging process parameters is changed from the first value to the second value. The measured rate of change can be determined by monitoring one or more purging process parameters in real-time as and/or after the first parameter in the second set is changed from a first value to a second value.

In one example, a measured rate of change for chamber pressure can be determined, and the measured rate of change for chamber pressure determined as and/or after the pressure control parameter (gate valve parameter and/or pump parameter) is changed from the first value to the second value.

In a second example, a measured rate of change for the flow rate for a process gas, such as a precursor-containing gas, into the thermal processing chamber, and the measured rate of change for the flow rate for the process gas is determined as and/or after a gas system flow control parameter (mass flow control valve position) is changed from a first value to a second value.

In a third example, a measured rate of change for the chamber temperature can be determined, and the measured rate of change for the chamber temperature is determined as and/or after a temperature control system parameter (heater power) is changed from a first power level to a second power level.

In a fourth example, a measured rate of change for the chamber chemistry can be determined, and the measured rate of change for the chamber chemistry is determined as and/or after a system parameter is changed from a first value to a second value.

In other examples, a measured rate of change for a deposited layer, an etched layer, a saturation state, or a contamination state can be determined.

Then, an inverse purging process model for the purging process can be executed that relates the first measured rate of change to a value for a second parameter in the second set of the purging process parameters to obtain a predicted value for the second parameter.

In one example, an inverse model may relate a process gas flow rate, to a measured rate of change for chamber pressure. In a second example, an inverse model may relate a chamber chemistry state (a process by-product or contaminant concentration) in the thermal processing chamber to a measured rate of change for chamber pressure. In a third example, an inverse model may relate a chamber chemistry state (a process by-product or contaminant concentration) in the thermal processing chamber to a measured rate of change for a flow rate for a process gas. In a fourth example, an inverse model may relate a wafer/substrate temperature to a measured rate of change for chamber temperature and/or substrate holder temperature. In other examples, an inverse model may relate a process and/or system parameter to a measured rate of change for a deposited layer, an etched layer, a saturation state, or a contamination state. Alternatively, other rates of change and other process parameters may be used.

Finally, the dynamic estimation error for the purging process can be calculated using a difference between the predicted value for the second parameter in the second set of the purging process parameters and an expected value for the second parameter, and the expected value can be determined using a BIST rule for the purging process. The expected value may be a dynamically changing value, a measured value, a stored value, a calculated value, and/or a recipe setpoint. Alternatively, the dynamic estimation error may be calculated using a difference between a predicted value, a measured value, a calculated value, and/or historical value for one or more process parameters.

In one example, the predicted value may be a predicted process gas flow rate and the expected value may be an expected process gas flow rate, and the process gas may include a precursor. In a second example, the predicted value may be a predicted chamber chemistry state and the expected value may be an expected chamber chemistry state. In other examples, the predicted and expected values may be deposition thicknesses, etching dimensions, saturation state values, or contamination state values.

When creating process models for an MLD procedure being performed at low pressures and using process recipes that include injecting a purging gas into a thermal processing chamber that can include a plurality of injection/control zones, one or more models can be created that relate a gas flow rate (GFR) for a process gas, such as a purging gas, to a rate of change for pressure (RCP) within the processing chamber and/or within one or more injection/control zones in the processing chamber. For example, a rate of change can be expressed as a positive or negative number. Alternatively, a pressure rise rate (PRR) may be used.

For example, a simplified monitoring procedure for a purging process that include creating a simplified model that relates a first process parameter, such as Purging Gas Flow Rate (PGFR), to the rate of change of a second process parameter, such as a Rate of Change of Pressure (RCP). Then, for any given process recipe step while and/or after a valve opening is changed and a purging gas flow is introduced, a Measured Rate of Change of Pressure (MRCP) can be obtained by monitoring the real-time process parameters during the purging process. Next, using the MRCP and one or more models, a Predicted Purging Gas Flow Rate (PPGFR) can be calculated. Then, the PPGFR can be compared to an Expected Purging Gas Flow Rate (EPGFR)—the expected gas flow rate can be associated with the purging gas and can be established by a setpoint in the purging process recipe. A purging process dynamic estimation error can be calculated using the difference between the predicted value PPGFR and expected value EPGFR. The purging process dynamic estimation error can be compared to a limit established for the current operating condition. Alternatively, other process parameters and other rates of change may be used.

In 1245, a query can be performed to determine when to continue the purging process. When the purging process is operating within limits established for the purging process, procedure 1200 can branch to 1260. When the purging process is not operating within limits established for the purging process, procedure 1200 can branch to 1250.

In one embodiment, the purging process dynamic estimation error is compared to an operational limit established for one or more BIST rules in the BIST table for the purging process. The purging process can continue when the purging process dynamic estimation error is within the operational limit. When creating and or verifying BIST rules, a purging process may be continued, paused, or stopped when the purging process dynamic estimation error is not within the operational limit. For example, operator and/or host intervention may be required.

In addition, the purging process dynamic estimation error can also be compared to a warning limit established for one or more BIST rules in the BIST table for the purging process. The purging process can be continued when the purging process dynamic estimation error is within the warning limit. The purging process can be paused and/or stopped when the purging process dynamic estimation error is not within the warning limit.

When the purging process dynamic estimation error is not with the operational limit, the purging process dynamic estimation error can then be compared to the warning limit; a warning message identifying a potential problem with the purging process and/or the MLD system can be sent and the purging process can be continued when the purging process dynamic estimation error is within the warning limit.

When the purging process dynamic estimation error is not with the warning limit, a fault message identifying a known problem with the purging process and/or the MLD system can be sent and the purging process can be stopped.

In various embodiments, warning messages can be sent that identify potential problems with the purging process, the thermal processing chamber, the pressure control system coupled to the thermal processing chamber, the gas supply system coupled to the thermal processing chamber, the temperature control system coupled to the thermal processing chamber, the control system coupled to the thermal processing chamber, or a combination thereof.

In addition, fault messages can be sent that identify known problems with the purging process, the thermal processing chamber, the pressure control system coupled to the thermal processing chamber, the gas supply system coupled to the thermal processing chamber, the temperature control system coupled to the thermal processing chamber, the control system coupled to the thermal processing chamber, or a combination thereof.

For example, BIST rules may be used for chamber components, temperature control elements, pressure control components, gas system components, and/or controller components.

In addition, the rate of change for a purging process parameter and/or the process drift value for the purging process can be monitored, and one or more notification messages can be sent when a purging process parameter and/or the process drift value for the purging process are approaching an operational and/or warning limit.

In 1250, a query can be performed to determine when to modify the monitoring process for the purging process. When the purging process dynamic estimation error is not within the warning limit established for the purging process, the controller can determine if a new purging process model, a new BIST rule, or a new purging process recipe, or a maintenance procedure, or a combination thereof is required. During a monitoring procedure, a controller can be used to determine if the purging process currently being performed is a new process or should be associated with a new BIST rule. Procedure 1200 can branch to 1255 when a procedure modification can be made. Procedure 1200 can branch to 1260 when a procedure modification cannot be made.

In 1255, the monitoring procedure can be modified. For example, a new BIST rule can be created for the purging process when a new BIST rule is required, the new BIST rule having new operational and warning limits, new tolerance values, and new messages and being based on at least one pre-existing BIST rule created for the process. The new BIST rule with the new operational and warning limits and the new tolerance values can be entered into a BIST table, and wafer processing can continue. A new process recipe can be established for the purging process when a new process recipe is required, the new process recipe can have new purging process parameters and a new BIST rule associated therewith. The new purging process parameters can have values within and/or outside of normal production limits. During normal production processing, the new purging process parameters can have values within the normal production limits. During non-production processing, the new purging process parameters can have values outside the normal production limits. The new BIST rule and new process recipe can be entered into a BIST table when the new BIST rule is not in the BIST table, and wafer processing can continue using the new process recipe. In addition, a new purging process model can be established.

The purging process can be paused or stopped when the monitoring procedure cannot be modified or a maintenance procedure is required.

In 1260, a query can be performed to determine when another purging process is required. When another purging process is required, procedure 1200 can branch to 1240, and when another purging process is not required, procedure 1200 can branch to 1265. When the purging process is performed multiple times and/or multiple purging processes are performed, one or more different purging process models can be executed and one or more different purging process recipes can be used.

When a purging process is performed, a chamber venting process, a chamber cleaning process, and/or an evacuation process can be performed. During the purging process, surface saturation/contamination zones can be determined on the surface of at least one of the plurality of wafers, and a physical and/or virtual sensor may be used for determining one or more parameters for one or more surface saturation/contamination zones. A purging gas can be introduced into the processing chamber during a purging process, and the purging gas can be used to substantially eliminate contaminants, such as the first process gas components, precursor molecules, and/or process by-products from the wafer surfaces and from the processing chamber. For example, this can cause the concentration of reactant species (precursor) at each wafer surface (saturation zone) to be approximately zero. Alternatively, contamination zones may be established for a wafer and/or processing chamber. A process time for a purging process can be determined using limits in the BIST table.

The operational conditions for a purging process can include limits for a concentration level of un-reacted first precursor molecules; limits for a concentration level of a precursor gas; limits for a concentration level of the purging gas; and limits for a concentration level of by-products from the purging process. In one embodiment, the desired value can be approximately zero. In alternate embodiments, the desired value can be greater than zero.

In alternate embodiments, the operational conditions may require that intelligent set points be used to control the uniformity of the deposited layer on the wafers. Methods for computing the contamination levels at across-wafer locations and the sensitivity of the contamination levels to purge gas flow set point variations have been described above.

In one embodiment, when using a second precursor-containing gas that is used to react with a first precursor-containing gas, a surface reaction state can be used, and a physical and/or virtual sensor can be used to determine when the surface reaction state has reached a desired value. The surface reaction state can be used to determine when the second precursor has completely reacted with the monolayer of the first precursor material on the surfaces of the plurality of wafers, and a substantially uniform film is deposited onto the surfaces of the plurality of wafers.

The operational conditions for a precursor process that uses a second precursor-containing gas can include: limits for the flow rate for the second precursor-containing gas; concentration values for one or more second reactant ($R_B$) species (precursor molecules); limits and models for the flow between the wafers; limits for a residence time for the second reactant species (precursor molecules); models and limits for determining concentration value for the second reactant species for one or more surface saturation zones; and models and limits for determining a reaction rate for one or more surface saturation zones. For example, a deposition process is dependent on saturated surface reactions between a first precursor deposited on the surface of the wafers and a second precursor and may be a self-limiting reaction.

When a second purging process is performed, a second purging gas can be introduced into the processing chamber during a purging process, and the second purging gas can be used to substantially eliminate contaminants created during a second precursor process, such as the second precursor-containing gas components, second precursor molecules, and/or process by-products from the wafer surfaces and from the processing chamber. For example, this can cause the concentration of the second reactant species (precursor) at each wafer surface (saturation zone) to be approximately zero. A process time for a second purging process can be determined using limits in a BIST table.

The operational conditions for a second purging process can include limits for a concentration level of un-reacted second precursor molecules; limits for a concentration level of a second precursor gas; limits for a concentration level of the second purging gas; and limits for a concentration level of by-products from the second purging process. In one embodiment, the desired value can be approximately zero. In alternate embodiments, the desired value can be greater than zero.

In 1265, a query can be performed to determine when a different process is required. When an additional different process is required, procedure 1200 can branch to 1270, and when an additional different process is not required, procedure 1200 can branch to 1275.

In 1270, one or more additional processes can be performed. When a process is stopped and/or paused, one or more wafers can be transferred to a storage location, and/or one or more wafers can be transferred to a storage location. In addition, after an error condition has been analyzed, one or more wafers can be transferred to a processing chamber.

In 1275, procedure 1200 can end. When procedure 1200 ends, one or more wafers can be removed from the processing chamber, transferred to a storage location, and/or transferred to a measurement tool.

For example, during procedure 1200, a second precursor can react with a monolayer of the first precursor material that has been adsorbed on the surface of the plurality of wafers, thereby forming a monolayer of desired material, such as $Si_3N_4$, $Al_2O_3$, $Ta_2O_5$, and HfSiON on the surface of each of the plurality of wafers.

When process parameters include chamber pressure $P_c$ the rate of change for chamber pressure during the process $\dot{P}_c$ can be modeled as:

$$\dot{P}_c = f_1(p_1, p_2, \ldots, p_n, v)$$

and a steady-state condition can be modeled as:

$$P_c = g_1(p_1, p_2, \ldots, p_n, v)$$

where $p_1$-$p_n$ are each process parameters for the process other than chamber pressure, v can be a process parameter related to a pressure control element coupled to the thermal processing chamber, and $P_c$ is the chamber pressure measured in mTorr. For example, v can be a valve angle opening measured in percent. Alternatively, the opening can be expressed as an angular position or an opening size. In addition, a pump may be used to control chamber pressure and it may be characterized using a pumping speed, a pumping volume, or a pressure difference.

When process parameters include chamber temperature $T_c$, the rate of change for chamber temperature during the process $\dot{T}_c$ can be modeled as:

$$\dot{T}_c = f_2(p_1, p_2, \ldots, p_n, h)$$

and a steady-state condition can be modeled as:

$$T_c = g_2(p_1, p_2, \ldots, p_n, h)$$

where $p_1$-$p_n$ are each process parameters for the process other than chamber temperature, h can be a process parameter related to a temperature control element coupled to the thermal processing chamber. For example, h can be a heater power measured in watts. Alternatively, other heating and cooling devices may be used. In addition, the heater may be characterized as a multi-zone device.

When process parameters include a reactant concentration R for a reactant species and the rate of change for reactant concentration during the process R can be modeled as:

$$\dot{R} = f_3(p_1, p_2, \ldots, p_n, r)$$

and a steady-state condition can be modeled as:

$$R = g_3(p_1, p_2, \ldots, p_n, r)$$

where $p_1$-$p_n$ are each process parameters for the process other than reactant concentration, r can be a process parameter related to a gas system control element coupled to the thermal processing chamber. For example, r can be a flow rate for a MFC measured in sccm. Alternatively, other gas system components may be used. In addition, a gas delivery system may be characterized as a multi-zone device. In alternate embodiments, the reactant concentration may include a chamber chemistry state, or a contaminant state.

When process parameters include wafer temperature $T_w$, the rate of change for wafer temperature during the process $\dot{T}_w$ can be modeled as:

$$\dot{T}_w = f_4(p_1, p_2, \ldots, p_n, z)$$

and a steady-state condition can be modeled as:

$$T_w = g_4(p_1, p_2, \ldots, p_n, z)$$

where $p_1$-$p_n$ are each process parameters for the precursor process other than substrate temperature, z can be a process parameter related to a temperature control element coupled to the thermal processing chamber and/or substrate holder. For example, z can be a heater power measured in watts. Alternatively, other heating and cooling devices may be used. In addition, the heaters may be characterized as multi-zone devices.

The process model can be based on the type of wafer boat, the type, position, and quantity of wafers, the type of thermal processing chamber, and/or the recipe to be performed. For example, the plurality of wafers can include curved and/or instrumented wafers, and the models can account for factors such as wafer curvature. When curved wafers are positioned in the boat, the gap between two curved wafers is variable, and the heat transfer and gas flow can be variable.

Figure 13:
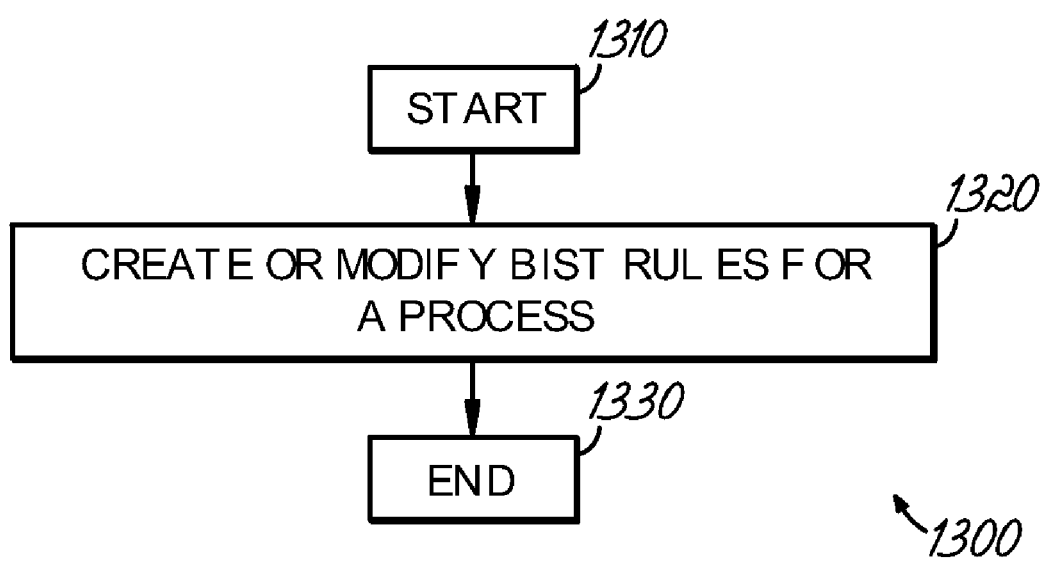
FIG. 13 illustrates a simplified flow diagram of a method of creating a BIST table for the real-time monitoring of a processing system in accordance with embodiments of the invention.

FIG. 13 illustrates a simplified flow diagram of a method of creating a BIST table for the real-time monitoring of a processing system in accordance with embodiments of the invention. Process 1300 can start in 1310.

In various embodiments, BIST tables that include dynamic operational conditions and dynamic models for real-time monitoring can be created for a MLD system, a thermal processing system, an etching system, a deposition system, a plating system, a polishing system, an implant system, a developing system, or a transfer system, or a combination of two or more thereof. In addition, BIST tables can be created for a MLD process, a thermal process, an etching process, a deposition process, a plating process, a polishing process, an implant process, a developing process, or a transfer process, or a combination of two or more thereof.

BIST tables can be established for subsystems including temperature control components, pressure control components, gas supply components, mechanical components, computing components, or software components, or combinations thereof.

When creating a BIST table, a process can be performed in which one or more of the processing parameters are changed from a first value to a second value. For example, the first value and/or second value can be chosen to establish a normal, warning, or fault condition to occur during a process. In other cases, the first value and/or second value can be chosen to magnify and/or amplify an error during a process.

An operational condition can be structured as follows:

Error<=Operational Limit (OL) defines an Operational Condition;

Error>(OL) and <=Warning Limit (WL) defines Warning Condition;

Error>(WL) defines a Fault Condition.

Alternatively, other structures can be used.

A number of processes can be performed a number of times to establish operational limits and warning limits that are expected to occur at different times during one or more processes, and a set of BIST rules can be created using the set of expected dynamic error conditions and their associated operational limits and warning limits.

One set of processes can be used to characterize system performance when the processing system is operating within the operational limits during a process. In this case, the dynamic estimation errors are less than the operational limits. For example, a number of processes can be performed a number of times to establish operational limits. These processes can be performed with process parameters within operational limits. These processes can produce a set of errors expected during "normal" operation, and the set of expected errors can be used to establish the operational limits. For example, operational limits can be made large enough to allow for some process variation. Design of Experiments (DOE) techniques can be used to minimize the number of processes required to generate operational limits.

Another set of processes can be used to characterize system performance when the processing system is operating just outside the operational limits during a process. In these cases, the dynamic estimation errors can be greater than the operational limits and less than the warning limits. For example, a second set of processes can be performed a number of times to establish warning limits. These processes can be performed with one or more process parameters just outside the operational limits. These processes can produce a set of errors expected when the system performance is deviated slightly from "normal" operation, and the set of errors can be used to establish the warning limits. For example, warning limits can be made large enough to allow some process drift and/or component degradation, and warning limits can be made small enough to ensure that high quality wafers are produced. The warning limits can also be used to predict and prevent failures from occurring. DOE techniques can be used to minimize the number of processes required to generate warning limits.

In 1320, BIST rules can be created for a first process. In one embodiment, one or more precursor processes can be performed on the wafers positioned in the processing chamber in the processing system. The wafers can be positioned at different heights in the processing chamber, and the processing chamber can be sealed. The wafers can include production wafers, instrumented wafers, test wafers, or dummy wafers, or combinations thereof. Alternatively, a plurality of wafers is not required.

The processing system can obtain operational data and use the operational data to establish one or more recipes to use during a process. In addition, the operational data can include dynamic and/or static modeling information for predicting the performance of the processing system during the process. Furthermore, the data can include measured and/or predicted data from previous runs. Operational conditions can also be used to establish a pre-processing state. For example, chamber pressure, chamber temperature, wafer temperature, and/or process gas conditions can be changed to operational values.

When creating BIST rules, one or more process models can be created using a set of nonlinear differential equations $\dot{x}_1$ and an output equation $y_1$, where $$\dot{x}_1 = f(x_1, p_1, u_1) + w_1$$

$$y_1 = g(x_1, p_1, u_1) + v_1$$

and the vector $x_1$ comprises a state vector for the process, the vector $p_1$ comprises one or more modeling parameters for the process, the vector $u_1$ comprises one or more inputs applied to the process, $w_1$ is a first additive white noise value having a zero mean, and $v_1$ is a second additive white noise value having a zero mean.

In one embodiment, the creation procedure can include measuring a rate of change for at least one parameter of a first set of process parameters as a first parameter in a second set of process parameters is changed from a first value to a second value. The second set of process parameters does not include the at least one parameter of the first set of process parameters. The measured rate of change can be determined by monitoring one or more process parameters in real-time as and/or after the first parameter of the second set is changed from a first value to a second value. For example, the monitoring process may include measuring a rate of change for chamber pressure as and/or after a valve and/or pump parameter is changed from a first value to a second value.

One process model can relate a rate of change for the at least one parameter of the first set to the second set of process parameters as and/or after the first parameter in the second set is changed from a first value to a second value. The second set of process parameters does not include the at least one parameter of the first set.

In some processing systems, an exhaust system can be coupled to the processing chamber, and the exhaust system can include a gate valve and the chamber pressure change rate can be dependent on the gate valve opening. For example, the BIST rules, the operational conditions, and/or process models may relate a rate of change for chamber pressure to the second set of process parameters that does not include chamber pressure as and/or after a valve opening is changed from a first position to a second position.

In addition, another model (inverse model) can be used with the measured rate of change to obtain a predicted value for a second parameter in the second set of process parameters. For example, another model (inverse model) may relate the second parameter, which may be a gas flow rate, to the measured rate of change for chamber pressure. Alternatively, other rates of change and other process parameters may be used.

The predicted value for the process parameter can be compared to an expected value for the process parameter. The expected value may be a dynamically changing value, a measured value, a stored value, a calculated value, and/or a recipe setpoint. For example, the predicted value may be a predicted gas flow rate and the expected value may be an expected gas flow rate.

During the creation, one or more dynamic estimation errors can be calculated using the differences between the predicted values for the process parameters and the expected values for the process parameters. For example, dynamic estimation errors may be calculated using the difference between a predicted gas flow rate and an expected gas flow rate. The table can include data for single gas flow rates and multi-gas flow rates. Alternatively, the dynamic estimation error may be calculated using a difference between a predicted value, a measured value, a calculated value, and/or historical value for a process parameter. BIST rules can be created for monitoring processes using rates of change for chamber pressure.

In some processing systems, a temperature control system can be coupled to the processing chamber, and the temperature control system can include a heater and the chamber temperature change rate can be dependent on the heater power. For example, a process model may relate a rate of change for chamber temperature to the second set of process parameters that does not include chamber temperature as and/or after a heater power is changed from a first power level to a second power level. In addition, another model (inverse model) may relate a reaction rate to the measured rate of change for chamber temperature, and a dynamic estimation error may be calculated using the difference between the predicted value for a reaction rate and the expected value for the reaction rate. BIST rules can be created for monitoring processes using rates of change for chamber temperature.

In some processing systems, a temperature control system can be coupled to a wafer holder in a processing chamber, and the temperature control system can include a wafer heater in the wafer holder and the wafer temperature change rate can be dependent on the heater power provided to wafer heater. For example, a process model may relate a rate of change for wafer temperature to the second set of process parameters that does not include wafer temperature as and/or after the wafer heater power is changed from a first power level to a second power level. In addition, another model (inverse model) may relate a flow rate for a backside gas to the measured rate of change for wafer temperature, and a dynamic estimation error may be calculated using the difference between the predicted value for a flow rate for a backside gas and the expected value for flow rate for a backside gas. BIST rules can be created for monitoring processes using rates of change for wafer temperature.

In one embodiment, the creation process can include measuring a rate of change for at least one parameter of a first set of process parameters as at least one parameter of a second set of process parameters is changed. The measured rate of change can be determined by monitoring one or more process parameters in real-time during the first process. Alternatively, the creation process may include measuring a rate of change for at least one parameter of a first set of process parameters after at least one parameter of a second set of process parameters is changed. In addition, the creation process can include measuring a rate of change for at least one parameter of a first set of process parameters as at least one parameter of a second set of process parameters is maintained at a substantially constant value.

For example, a new BIST rule may be created for a process when a dynamic estimation error calculated for the process cannot be associated with a BIST rule in the BIST table, and a creation procedure may be paused and/or stopped when a new BIST rule cannot be created.

In addition, new operational limits can be established for the new BIST rule. In one embodiment, the new operational limits for the new BIST rule are based on the operational limits associated with the dynamic estimation error for the process. Alternatively, new operational limits may be determined independently.

In one embodiment, new warning limits can be established based on the new operational limits. Alternatively, new warning limits may be determined independently.

A warning message can be created and associated with the new BIST rule. For example, this warning message can be sent when the dynamic estimation error is outside the operational limits but within the new warning limits established for the new BIST rule. A fault message can also be created and associated with the new BIST rule. For example, this fault message can be sent when the dynamic estimation error is not within the new warning limits established for the new BIST rule. During a creation procedure, process parameters may be changed to values that cause fault conditions so that a more complete BIST table is created.

In other cases, new real-time dynamic models can be created and/or executed to generate new BIST rules. For example, new process models can be created for new rates of change and/or new predicted parameter values. In addition, new expected values may be used and new dynamic estimation errors can be calculated. In addition, new dynamic estimation errors may be calculated using different predicted, measured, calculated, and/or historical values for the process parameters.

Procedure 1300 can end in 1330.

BIST rules can be created and used during pre-processing. For example, the pressure in a processing chamber may be dynamically changed from a first pressure to an operating pressure, and a BIST rule can be used to monitor chamber pressure error and a warning or fault message can be sent when the chamber is not sealed properly. In addition, the processing chamber temperature can be changed from a first temperature to an operational temperature during a pre-processing time, and a BIST rule can be used to monitor chamber temperature error and a warning or fault message can be sent when the heater has failed. Furthermore, the chamber chemistry can be changed during a pre-processing time, and a BIST rule may be used to monitor chamber chemistry error and a warning or fault message can be sent when a gas supply system component has failed.

The process dynamic estimation error can be used to establish new BIST rules and/or new operational conditions and/or confirm current data.

Physical and/or virtual sensors can be used to create and/or verify BIST rules, models, operational conditions, and measured values. For example, a measured rate of change for the processing chamber can include measuring temperature for each of the plurality of temperature control zones. Alternatively, measurements may not be required for each zone. In other embodiments, optical techniques can be used to measure temperature in the chamber and/or the wafer temperature.

One or more measured dynamic process responses can be created during a process. The measured dynamic process response can be created each time one or more of the processing parameters is changed from a first value to a second value during a process. When a process is performed multiple times, one or more different measured dynamic process responses can be created. Process-related differences between measured dynamic process responses can be calculated when new measured dynamic process responses are created.

Alternatively, a dynamic estimation error can be determined using a difference between a predicted dynamic process response and a measured dynamic process response each time one or more of the processing parameters is changed during a process. Furthermore, the dynamic estimation error can be compared to operational thresholds established by one or more rules in a BIST table each time a new dynamic estimation error is determined during a process. The process can continue when the dynamic estimation error is within the operational thresholds established by one or more rules in the BIST table. In this case, the processing system is operating within the operational limits during the process. Techniques for creating and using BIST tables are taught in co-pending U.S. patent application Ser. No. 11/217,230 and Ser. No. 11/217,276 each entitled "BUILT-IN SELF TEST FOR A THERMAL PROCESSING SYSTEM" and each filed on Sep. 1, 2005, and both of which are incorporated by reference herein in their entirety.

In an alternate embodiment, when a process parameter is changed from a first set point value to a second set point value, the change can occur in a series of steps. A BIST rule, an operational condition, and/or a real-time dynamic model may be created/executed/verified for each step.

The operational conditions data can include predicted dynamic process responses, predicted dynamic thermal profiles, predicted dynamic chamber pressures, predicted dynamic gas flows, predicted chamber chemistries, predicted flow profiles, or predicted process times, or a combination thereof.

When a deposition procedure is performed, a uniform thickness can be deposited in each deposition cycle. Since the film is grown in a layer-by-layer mode, and the total film thickness is determined by the number of deposition cycles, the use of low-pressure process models in the invention increases the throughput by processing a number of wafers at one time and reducing the time required for each deposition cycle. The invention can provide for faster rates of change for process parameters that can lead to increased throughput, and can provide improved uniformity and step coverage on wafers having high aspect ratio features. Furthermore, using the modeling techniques of the present invention in etching processes can provide improved uniformity within high aspect ratio features including improved critical dimension (CD) control and profile uniformity control.

While the present invention has been illustrated by a description of various embodiments and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the scope of the general inventive concept.

What is claimed is:

1. A method of monitoring a single-wafer processing system comprising:

positioning a wafer on a wafer holder in a single-wafer processing chamber, wherein a reduced pressure is established in the single-wafer processing chamber;

performing a single-wafer process;

monitoring the single-wafer process using a set of non-linear differential equations $\dot{x}_1$ and an output equation $y_1$, wherein $$\dot{x}_1 = f(x_1, p_1, u_1)$$

$$y_1 = g(x_1, p_1, u_1)$$

and $x_1$, $p_1$, and $u_1$ are single-wafer process parameters in which the first vector $x_1$ comprises a first state vector for the single-wafer process, the first vector $p_1$ comprises one or more modeling parameters for the single-wafer process, the vector $u_1$ comprises one or more inputs applied to the single-wafer process;

calculating a dynamic estimation error for the single-wafer process;

comparing the dynamic estimation error to an operational limit established by one or more BIST rules in a BIST table for the single-wafer process;

continuing the single-wafer process when the dynamic estimation error is within the operational limit; and comparing the dynamic estimation error to a warning limit established for the single-wafer process when the dynamic estimation error is not within the operational limit, and either sending a warning message identifying a potential problem with the single-wafer process and/or single-wafer processing system and continuing the single-wafer process when the dynamic estimation error is within the warning limit, wherein the warning message is determined by the BIST rule currently being used, or sending a fault message identifying a known problem with the single-wafer process and/or single-wafer processing system and stopping the single-wafer process when the dynamic estimation error is not within the warning limit established for the single-wafer process, wherein the fault message is determined by the BIST rule currently being used.

2. The method of claim 1, further comprising:

determining a process model for the single-wafer process that relates a rate of change for at least one parameter of a first set of single-wafer process parameters to a second set of single-wafer process parameters as and/or after a first parameter in the second set is changed from a first value to a second value, wherein the second set does not include the at least one parameter of the first set;

determining a measured rate of change for the at least one parameter of the first set, wherein the measured rate of change is determined as and/or after the first parameter in the second set is changed from the first value to the second value;

executing an inverse process model for the single-wafer process that relates the measured rate of change to a value for a second parameter in the second set of single-wafer process parameters to obtain a predicted value for the second parameter; and calculating the dynamic estimation error for the single-wafer process using a difference between the predicted value for the second parameter and an expected value for the second parameter, wherein the expected value for the second parameter is determined using the BIST rule.

3. The method of claim 2, wherein the at least one parameter of the first set includes wafer temperature $T_w$ and a wafer temperature change rate $\dot{T}_w$ is modeled as:

$$\dot{T}_w = f_1(p_1, p_2, \ldots, p_n, z)$$

and a steady-state condition is modeled as:

$$T_w = G_1(p_1, p_2, \ldots, p_n, z)$$

where $p_1$-$p_n$ are each single-wafer process parameters for the single-wafer process other than wafer temperature, wherein a temperature control system is coupled to a wafer holder in the single-wafer processing chamber, z comprises a temperature control system parameter, and $T_w$ is the wafer temperature measured in degrees Celsius.

4. The method of claim 3, wherein the temperature control system includes a heating element, and the temperature control system parameter comprises a power level provided to the heating element.

5. The method of claim 3, wherein the temperature control system includes a flow control element for a backside gas, and the temperature control system parameter comprises a valve position in the flow control element.

6. The method of claim 3, wherein the temperature control system is coupled to the single-wafer processing chamber.

7. The method of claim 2, wherein the at least one parameter of the first set includes chamber temperature and a chamber temperature change rate $\dot{T}_c$ is modeled as:

$$\dot{T}_c = f_2(p_1, p_2, \ldots, p_n, h)$$

and a steady-state condition is modeled as:

where $p_1$-$p_n$ are each single-wafer process parameters for the single-wafer process other than chamber temperature, wherein a temperature control system is coupled to the single-wafer processing chamber, h comprises a temperature control system parameter, and $T_c$ is the thermal processing chamber temperature measured in degrees Celsius.

8. The method of claim 7, wherein the temperature control system includes a heating element, and the temperature control system parameter comprises a power level measured in watts provided to the heating element.

9. The method of claim 3, wherein the temperature control system is coupled to a wafer holder in the single-wafer processing chamber.

10. The method of claim 2, wherein the at least one parameter of the first set includes chamber pressure and a chamber pressure change rate $\dot{P}_c$ is modeled as:

$$\dot{P}_c = f_3(p_1, p_2, \ldots, p_n, v)$$

and a steady-state condition is modeled as:

$$P_c = g_3(p_1, p_2, \ldots, p_n, v)$$

where $p_1$-$p_n$ are each single-wafer process parameters for the single-wafer process other than chamber pressure, wherein a pressure control system is coupled to the single-wafer processing chamber, v comprises a pressure control system parameter, and $P_c$ is the chamber pressure measured in mTorr.

11. The method of claim 10, wherein the pressure control system includes a gate valve, and the pressure control system parameter v comprises a gate valve opening measured in percent.

12. The method of claim 10, wherein the pressure control system includes a pump, and the pressure control system parameter v comprises a pumping rate measured in milliliters/second.

13. The method of claim 2, wherein the at least one parameter of the first set includes a reactant concentration R for a reactant species and a reactant concentration change rate $\dot{R}$ is modeled as:

$$\dot{R} = f_4(p_1, p_2, \ldots, p_n, r)$$

and a steady-state condition is modeled as:

$$R = g_4(p_1, p_2, \ldots, p_n, r)$$

where $p_1$-$p_n$ are each single-wafer process parameters for the single-wafer process other than reactant concentration, wherein a gas supply system is coupled to the single-wafer processing chamber, r comprises a gas supply system parameter, and R represents a reactant concentration in percent.

14. The method of claim 13, wherein the gas supply system includes a MFC, and the gas supply system parameter r comprises a flow rate for the MFC.

15. The method of claim 2, wherein a pressure control system is coupled to the single-wafer processing chamber, the at least one parameter of a first set comprises chamber pressure and the first parameter in the second set comprises a pressure control system parameter, the second set includes a flow rate for a process gas but does not include the chamber pressure, the inverse process model relates the measured rate of change for the chamber pressure to the flow rate for the process gas to obtain a predicted value for the flow rate for a process gas, and the expected value for the flow rate for a process gas is determined using the BIST rule for the single-wafer process.

16. The method of claim 2, further comprising:
flowing a backside gas between the wafer holder and the wafer; and
executing an inverse process model for the single-wafer process that relates a measured rate of change for the wafer temperature to a flow rate for the backside gas to obtain a predicted value for the flow rate for the backside gas.

17. The method of claim 2, further comprising:
flowing a backside gas between the wafer holder and the wafer; and
executing an inverse process model for the single-wafer process that relates a measured rate of change for the wafer temperature to a wafer holder temperature to obtain a predicted value for the wafer holder temperature.

18. The method of claim 1, wherein the single-wafer processing system comprises a monolayer deposition system, a thermal processing system, an etching system, a deposition system, a plating system, a polishing system, an implant system, a developing system, or a transfer system, or a combination of two or more thereof.

19. The method of claim 1, wherein the single-wafer process comprises a thermal process, an etching process, a deposition process, a plating process, a polishing process, an implant process, a developing process, or a transfer process, or a combination of two or more thereof.

20. The method of claim 1, further comprising:
changing the first parameter in the second set of single-wafer process parameters using a series of steps; and
determining the process model using the series of steps.

21. The method of claim 1, further comprising:
establishing a plurality of measurement zones for the wafer; and
determining the process model using the plurality of measurement zones.

22. The method of claim 1, further comprising:
establishing a plurality of zones in the single-wafer processing chamber; and
determining the process model using the plurality of zones in the single-wafer processing chamber.

23. The method of claim 1, further comprising:
creating a wafer curvature model when the wafer is a curved wafer; and
determining the process model using the wafer curvature model.

24. The method of claim 1, further comprising:
determining if a new BIST rule for the single-wafer process can be created; and
sending a fault message and stopping the single-wafer process when a new BIST rule cannot be created.

25. The method of claim 24, further comprising:
creating a new BIST rule for the single-wafer process when a new BIST rule is required, the new BIST rule having a new operational limit and new tolerance values and being based on one or more dynamic estimation errors determined for the wafer during the single-wafer process;
entering the new BIST rule with the new operational limit and the new tolerance values into a BIST table; and
continuing the single-wafer process.

26. The method of claim 1, wherein the single-wafer process comprises a precursor deposition process or a purging process.

27. The method of claim 1, wherein a virtual sensor is used for determining the measured rate of change.

28. A computer-readable medium comprising computer-executable instructions for:
positioning a wafer on a wafer holder in a single-wafer processing chamber, wherein a reduced pressure is established in the single-wafer processing chamber;
performing a single-wafer process;
monitoring the single-wafer process using a set of non-linear differential equations $\dot{x}_1$ and an output equation $y_1$, wherein $$\dot{x}_1 = f(x_1, p_1, u_1)$$

$$y_1 = g(x_1, p_1, u_1)$$

and the first vector $x_1$ comprises a first state vector for the single-wafer process, the first vector $p_1$ comprises one or more modeling parameters for the single-wafer process, the vector $u_1$ comprises one or more inputs applied to the single-wafer process;
calculating a dynamic estimation error for the single-wafer process;
comparing the dynamic estimation error to an operational limit established by one or more BIST rules in a BIST table for the single-wafer process;
continuing the single-wafer process when the dynamic estimation error is within at least one operational limit; and
comparing the dynamic estimation error to a warning limit established for the single-wafer process when the dynamic estimation error is not within the operational limit, and either
sending a warning message identifying a potential problem with the single-wafer process and/or single-wafer processing system and continuing the single-wafer process when the dynamic estimation error is within the warning limit, wherein the warning message is determined by the BIST rule currently being used, or
sending a fault message identifying a known problem with the single-wafer process and/or single-wafer processing system and stopping the single-wafer process when the dynamic estimation error is not within the warning limit, wherein the fault message is determined by the BIST rule currently being used.

29. A method of operating a controller in a processing system, the method comprising the steps of:
instructing the single-wafer processing system to position a wafer on a wafer holder in a single-wafer processing chamber, wherein a reduced pressure is established in the single-wafer processing chamber;
instructing the single-wafer processing system to perform a single-wafer process;

instructing the single-wafer processing system to monitor the single-wafer process using a set of nonlinear differential equations $\dot{x}_1$ and an output equation $y_1$, wherein $$\dot{x}_1 = f(x_1, p_1, u_1)$$

$$y_1 = g(x_1, p_1, u_1)$$

and the first vector $x_1$ comprises a first state vector for the single-wafer process, the first vector $p_1$ comprises one or more modeling parameters for the single-wafer process, the vector $u_1$ comprises one or more inputs applied to the single-wafer process;
    instructing the single-wafer processing system to calculate a dynamic estimation error for the single-wafer process;
    instructing the single-wafer processing system to compare the dynamic estimation error to an operational limit established by one or more BIST rules in a BIST table for the single-wafer process;
    instructing the single-wafer processing system to continue the single-wafer process when the dynamic estimation error is within the operational limit; and
    instructing the single-wafer processing system to compare the dynamic estimation error to a warning limit established for the single-wafer process when the dynamic estimation error is not within the operational limit, and either
    instructing the single-wafer processing system to send a warning message identifying a potential problem with the single-wafer process and/or single-wafer processing system and to continue the single-wafer process when the dynamic estimation error is within the warning limit, wherein the warning message is determined by the BIST rule currently being used, or
    instructing the single-wafer processing system to send a fault message identifying a known problem with the single-wafer process and/or single-wafer processing system and to stop the single-wafer process when the dynamic estimation error is not within the warning limit, wherein the fault message is determined by the BIST rule currently being used.

30. A method of monitoring a single-wafer processing system comprising:
    performing a single-wafer process, wherein a wafer is positioned on a wafer holder in a single-wafer processing chamber, and a reduced pressure is established in the wafer processing chamber;
    calculating a dynamic estimation error for the single-wafer process;
    comparing the dynamic estimation error to limits established by a pre-existing BIST rule in a BIST table for the single-wafer process;
    continuing the single-wafer process when the dynamic estimation error is within the limits established by the pre-existing BIST rule; and
    when the dynamic estimation error is not within the limits established by the pre-existing BIST rule, either
    selecting another pre-existing BIST rule and repeating the comparing step when another pre-existing BIST rule for the single-wafer process is available in the BIST table, or
    sending a fault message and determining if a new process model, a new BIST rule, a new process recipe, or a maintenance procedure, or a combination thereof, is required when another pre-existing BIST rule for the single-wafer process is not available in the BIST table.

31. The method of claim 30, further comprising:
    creating a new BIST rule for the single-wafer process when a new BIST rule is required, the new BIST rule having new limits, new tolerance values, and new messages and being based on at least one of the pre-existing BIST rules;
    entering the new BIST rule with the new limits and the new tolerance values into a BIST table; and
    continuing to process wafers.

32. The method of claim 30, further comprising:
    establishing a new process recipe for the single-wafer process when a new process recipe is required, the new process recipe having a new process parameters and a new BIST rule associated therewith;
    entering the new BIST rule and new process recipe into the BIST table when the new BIST rule is not in the BIST table; and
    continuing to process wafers using the new process recipe.

33. The method of claim 30, further comprising:
    stopping the single-wafer process when a new BIST rule cannot be created, a new process recipe cannot be established, or a maintenance procedure is required.

* * * * *

UNITED STATES PATENT AND TRADEMARK OFFICE
CERTIFICATE OF CORRECTION

Page 1 of 3

PATENT NO. : 7,340,377 B2
APPLICATION NO. : 11/456020
DATED : March 4, 2008
INVENTOR(S) : Kaushal et al.

It is certified that error appears in the above-identified patent and that said Letters Patent is hereby corrected as shown below:

In the Drawings

Drawing sheet 10, FIG. 12, second to last box labeled "*1265*" should read --*1270*--.

In the Specification

Col. 1, line 63, "types of issue" should read --types of issues--.

Col. 1, line 66, "fail be" should read --fail to be--.

Col. 2, line 28, "vector pi" should read --vector $p_1$--.

Col. 6, line 25, "portion 119*a*and a" should read --portion 119*a* and a--.

Col. 10, line 45, "in response the execution of" should read --in response to the execution of--.

Col. 11, line 11, "change form one value" should read --change from one value--.

Col. 11, line 42, "Apparatus, which is" should read --Apparatus," which is--.

Col. 11, line 58, "exhaust valve angle." should read --exhaust valve angle are actuation variables (AV).--.

Col. 12, line 22, "wafers and/or wafers;" should read --wafers and/or substrates;--.

Col. 12, line 47, "BIST rues," should read --BIST rules,--.

Col. 12, line 55, "flowing, etc.)" should read --flowing, etc.).--.

Signed and Sealed this
Fourteenth Day of October, 2014

Michelle K. Lee
*Deputy Director of the United States Patent and Trademark Office*

CERTIFICATE OF CORRECTION (continued)
U.S. Pat. No. 7,340,377 B2

Col. 16, line 16, "$E\{x_0x_0^{T\}=P}_0$" should read --$E\{x_0x_0^T\}= P_0$--.

Col. 16, line 44, "Is $\|u_s u_{ref}\| \le \varepsilon$ ?" should read --Is $\|u_s - u_{ref}\| \le \varepsilon$ ?--.

Col. 18, line 41, "variety of condition in order" should read --variety of conditions in order--.

Col. 22, line 58, "etc), and the model" should read --etc.), and the model--.

Col. 23, line 15, "$T_c g_2 (p_1, p_2, ..., p_n, h)$" should read --$T_c = g_2 (p_1, p_2, ..., p_n, h)$--.

Col. 23, line 23, "function f a process" should read --function $f$ for a process parameter--.

Col. 24, line 8, "$p_i = f^{3-1}(\dot{T}_w)$" should read -- $p_i = f_3^{-1}(\dot{T}_w)$ --.

Col. 27, line 60, "performed. On" should read --performed. One--.

Col. 31, lines 39-40, "an "un-measurable" (MURR)" should read --an "un-measurable" process parameter (MURR)--.

Col. 31, line 44, "predicted/calculated (PGFR)" should read --predicted/calculated gas flow rate (PGRF)--.

Col. 33, line 41, "In second example," should read --In a second example,--.

Col. 34, line 41, "flow rate, to a measured" should read --flow rate to a measured--.

Col. 36, line 6, "not with the operational" should read --not within the operational--.

Col. 36, line 14, "not with the warning limit," should read --not within the warning limit,--.

Col. 38, line 66, "can be stopped, The" should read --can be stopped. The--.

Col. 39, line 17, "In second example," should read --In a second example,--.

Col. 40, line 18, "flow rate, to a measured" should read --flow rate to a measured--.

Col. 41, line 2, "process that include creating" should read --process that includes creating--.

Col. 41, line 48, "with the operational limit," should read --within the operational limit,--.

Col. 41, line 55, "with the warning limit," should read --within the warning limit,--.

Col. 44, line 30, "$Si_3N_4$, $Al_2O_3$, $_{Ta2}O_5$," should read --$Si_3N_4$, $Al_2O_3$, $Ta_2O_5$,--.

CERTIFICATE OF CORRECTION (continued)
U.S. Pat. No. 7,340,377 B2

Col. 45, line 3, "process R" should read --process $\dot{R}$ --.

Col. 51, line 63, "$T_w = G_1 (p_1, p_2, ..., p_n, z)$" should read --$T_w = g_1 (p_1, p_2, ..., p_n, z)$--.

Col. 52, line 18, "condition is modeled as:" should read --condition is modeled as:
--$T_c = g_2 (p_1, p_2, ..., p_n, h)$--.

Col. 52, line 38, "$P_c g_3 (p_1, p_2, ..., p_n, v)$" should read --$P_c = g_3 (p_1, p_2, ..., p_n, v)$--.

Col. 56, line 34, "having a new process parameters" should read --having new process parameters--.